(12) United States Patent
Mourali et al.

(10) Patent No.: US 8,332,003 B2
(45) Date of Patent: Dec. 11, 2012

(54) DEVICE PROVIDING BIOLOGICAL PROTECTION AGAINST THE ELECTROMAGNETIC WAVES EMITTED BY A MOBILE TELEPHONE

(75) Inventors: Cyril Mourali, Paris (FR); Serge Parienti, Boulogne-Billancourt (FR); Joseph Saillard, Saint Herblain (FR); Janic Chauveau, Vay (FR); Marc Brunet, Saint Julien de Concelles (FR); Henri Collette, Houilles (FR)

(73) Assignees: Dephasium Ltd., London (GB); University de Nantes, Nantes (FR)

( * ) Notice: Subject to any disclaimer, the term of this patent is extended or adjusted under 35 U.S.C. 154(b) by 329 days.

(21) Appl. No.: 12/604,078

(22) Filed: Oct. 22, 2009

(65) Prior Publication Data

US 2010/0197369 A1   Aug. 5, 2010

(51) Int. Cl.
*H04M 1/00* (2006.01)
*H04B 1/38* (2006.01)

(52) U.S. Cl. ............... 455/575.8; 455/575.5; 455/575.1; 455/90.3; 455/550.1

(58) Field of Classification Search ............... 455/550.1, 455/556.1, 556.2, 557, 575.1, 90.3, 575.8, 455/575.5
See application file for complete search history.

(56) References Cited

U.S. PATENT DOCUMENTS

| | | | |
|---|---|---|---|
| 7,099,631 B2 * | 8/2006 | Lee et al. | 455/90.1 |
| 7,330,705 B2 * | 2/2008 | Lee | 455/117 |
| 7,555,120 B2 * | 6/2009 | Joo | 379/433.12 |
| 7,672,640 B2 * | 3/2010 | Nyshadham et al. | 455/41.1 |
| 7,747,007 B2 * | 6/2010 | Hyun et al. | 379/437 |
| 7,969,382 B2 * | 6/2011 | Kim et al. | 345/1.1 |
| 8,099,145 B2 * | 1/2012 | Yeh | 455/575.4 |
| 8,107,235 B2 * | 1/2012 | Yeh | 361/679.56 |
| 8,220,626 B2 * | 7/2012 | Liu | 206/320 |
| 2002/0137475 A1 | 9/2002 | Shou et al. | |
| 2004/0023682 A1 * | 2/2004 | Lee et al. | 455/550.1 |
| 2004/0176125 A1 * | 9/2004 | Lee | 455/522 |
| 2005/0090299 A1 * | 4/2005 | Tsao et al. | 455/575.5 |
| 2008/0161048 A1 * | 7/2008 | Chuang | 455/557 |
| 2011/0003623 A1 * | 1/2011 | Na et al. | 455/575.1 |

FOREIGN PATENT DOCUMENTS

| | | |
|---|---|---|
| DE | 20306964 U1 | 7/2003 |
| GB | 2363003 A | 12/2001 |
| WO | 02-095867 A1 | 11/2002 |

OTHER PUBLICATIONS

French Search Report dated Jan. 18, 2010.

\* cited by examiner

*Primary Examiner* — Tilahun B Gesesse
(74) *Attorney, Agent, or Firm* — Lowe, Hauptman, Ham & Berner, LLP

(57) ABSTRACT

A device providing biological protection against the electromagnetic waves emitted by a mobile telephone. A protective element against electromagnetic waves, arranged so that the user is able to protect himself or herself from the electromagnetic waves emitted by the mobile telephone during use, with the protective element reflecting these signals away from the user.

18 Claims, 17 Drawing Sheets

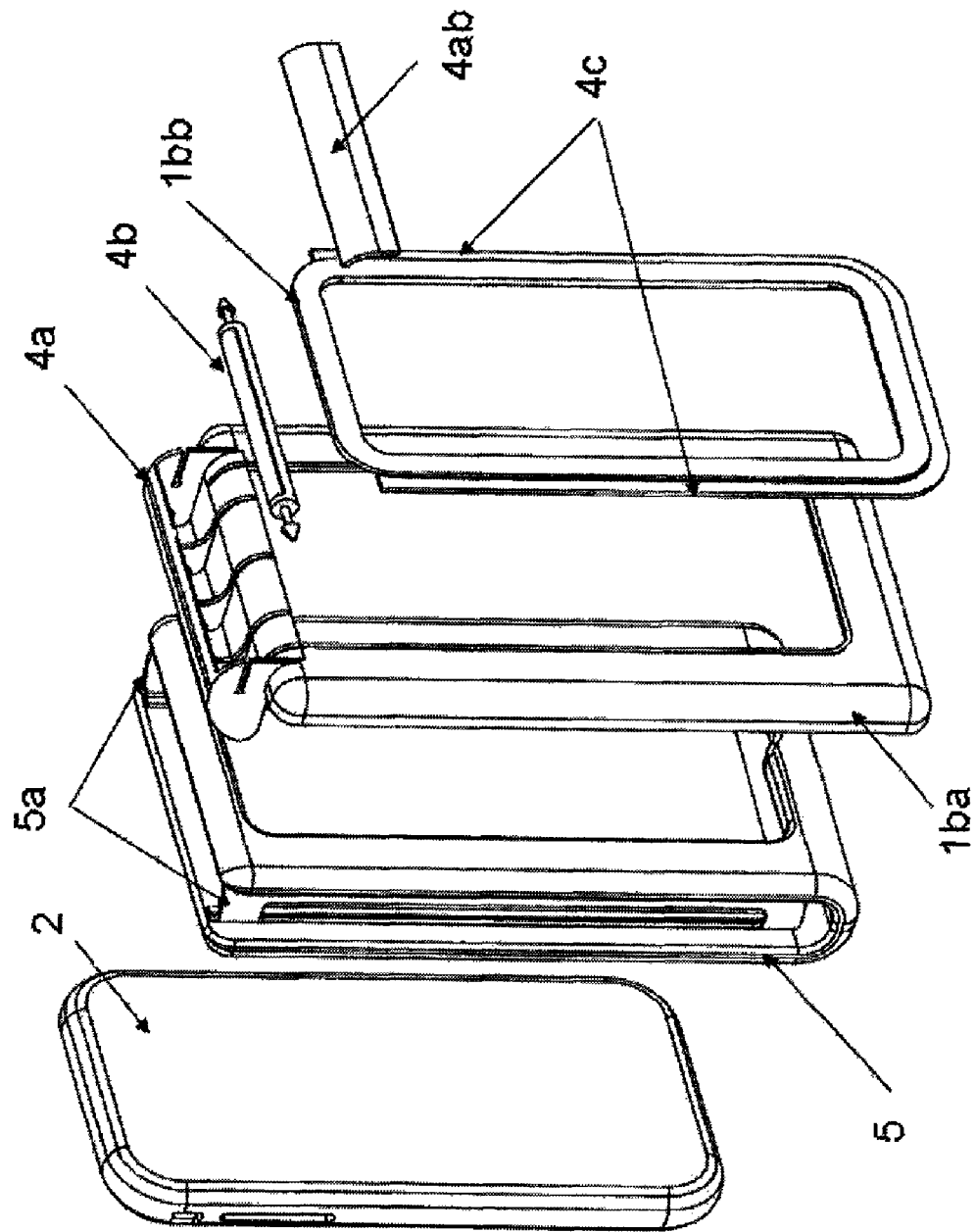

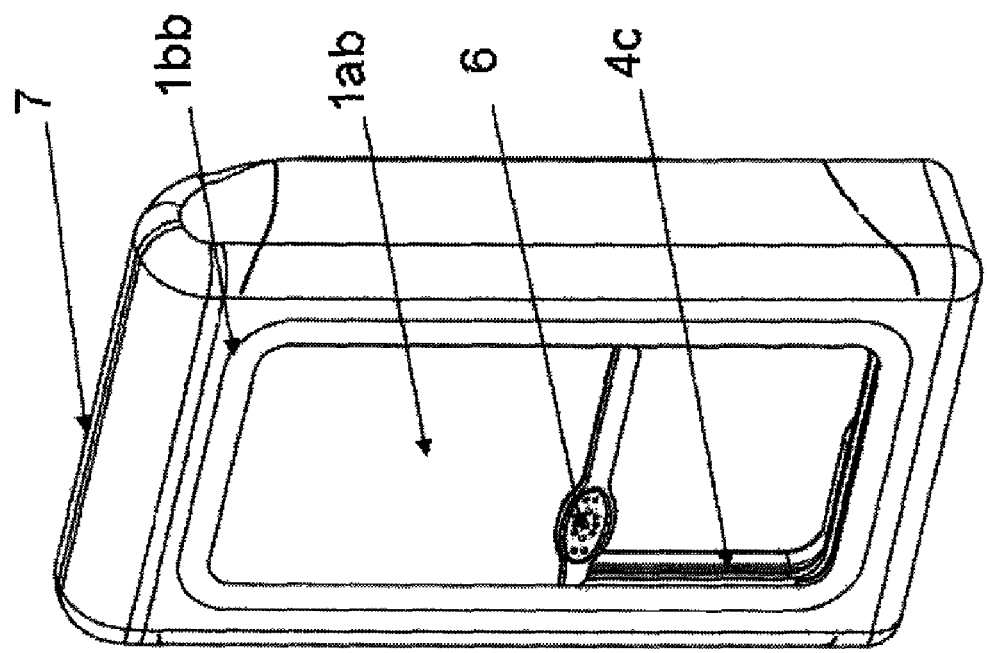
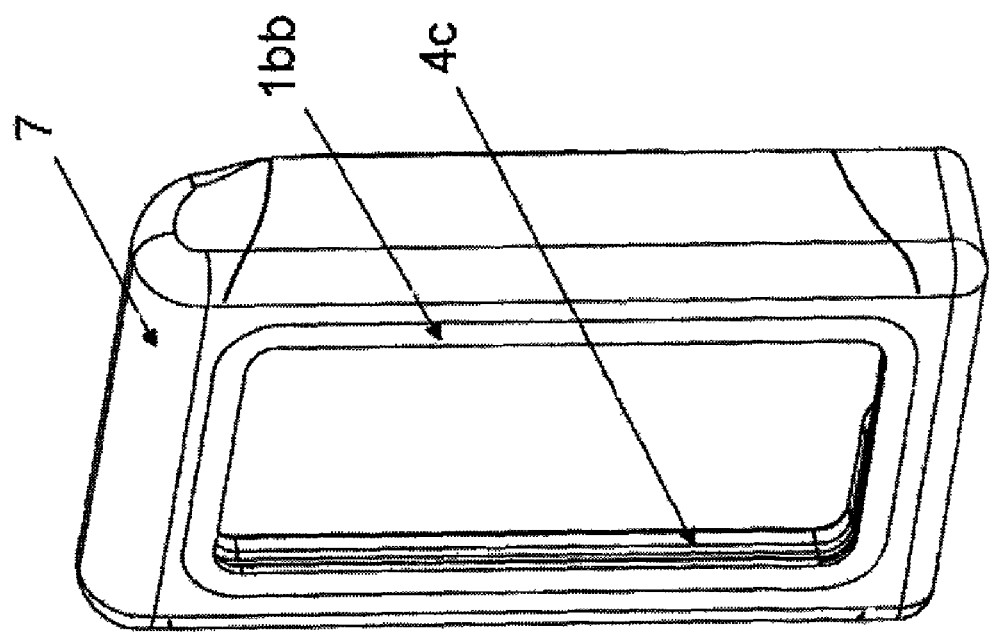

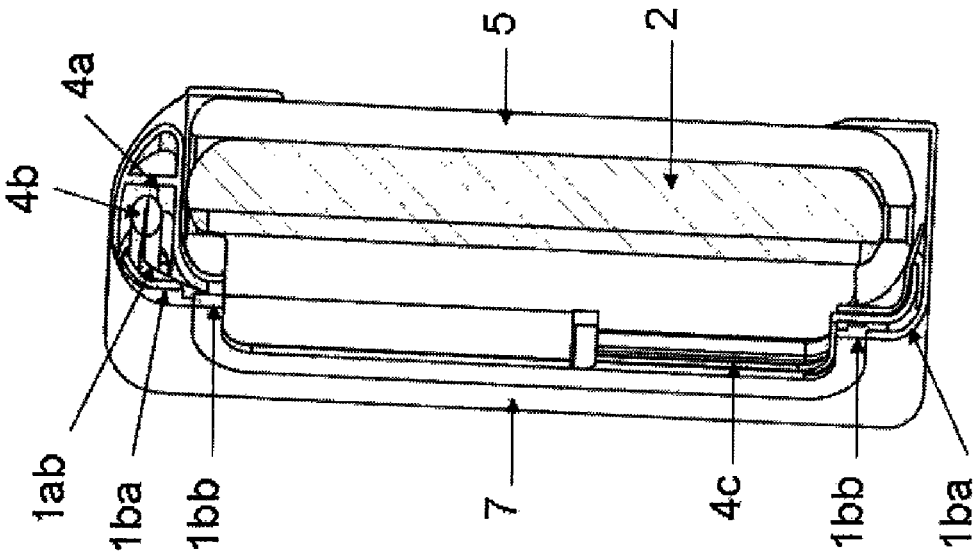
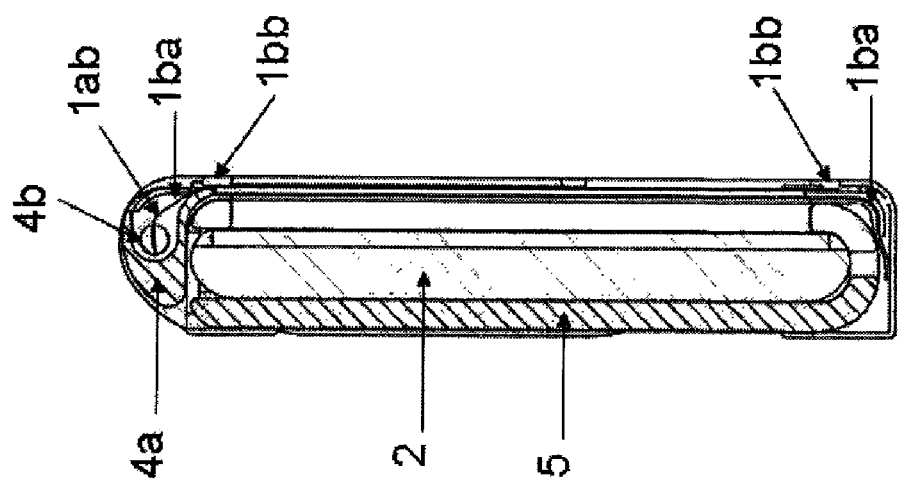

DEVICE PROVIDING BIOLOGICAL PROTECTION AGAINST THE ELECTROMAGNETIC WAVES EMITTED BY A MOBILE TELEPHONE

RELATED APPLICATIONS

The present application is based on, and claims priority from, French Application Number 08/05878, filed Oct. 23, 2008, the disclosure of which is hereby incorporated by reference herein in its entirety.

FIELD

This present invention concerns the field of individual biological protection devices against electromagnetic pollution emissions.

This present invention more particularly concerns a device providing biological protection against the electromagnetic waves emitted by a mobile telephone.

BACKGROUND

In a wireless world, in which individuals are in constant communication, mobile technologies of every kind are proliferating, and as a consequence, the generation of electromagnetic waves. Thus, most of the inhabitants of developed countries are in possession of a full set of radiating appliances, such as mobile and wireless telephones (more than 2 billion subscribers currently, and 3 billion forecast by 2010), computers (1 billion computers sold), WiFi modems (1 billion subscribers to internet, who in time will all be WiFi), game consoles, Bluetooth headsets, and so on.

The densification of the electromagnetic sources in our environment raises the very relevant question of the effects on health, and the housing of the mobile telephone is the most significant. In fact this segment of the telecommunication market is experiencing huge growth, and since its appearance on the market, the mobile telephone has been giving rise to the most virulent arguments concerning the exposure of individuals to its powerful electromagnetic radiation, which is continuous and close to the brain.

Up to the present time, the question of these dangers has met with no concrete and definitive response, and the polemic is now at its height. Many international studies carried out on this subject oscillate in their conclusions between "a health catastrophe" and "slight dangers", but have never defined the risk as zero.

In France, following the publication of the decree of Oct. 8, 2003, mobile telephones must have an index of Specific Absorption Rate (SAR) below 2 W/kg over 10 g of human tissue at the level of the trunk and head. In the United States, the Federal Communications Commission requires that mobile telephones to be sold have a SAR level below 1.6 W/kg taken over a volume of 1 g of human tissue. The most recent mobile telephones that have appeared on the market emit a level of electromagnetic radiation that is still responsible for a specific absorption rate of the order of 1 W/kg. Nonetheless, in the light of a lack of past experience and of uncertainties, we are brought back to the precautionary principle, which is an essential constitutional principle under which it appears necessary to develop individual biological protection devices that can be used to limit exposure of the human body to electromagnetic pollution.

Prior art already describes passive antenna systems providing biological protection from a large frequency spectrum of electromagnetic waves, which come in the form of a range of patches that need only be applied onto the mobile technology equipment, and between the said equipment and the user, in order to protect the user from the electromagnetic waves emitted by the equipment. These systems use the physical principle of 180° phase shifting of the electromagnetic waves.

However, due to the small size of the patches in relation to the size of the mobile equipment, the performance of the devices is necessarily limited. Moreover, these techniques are ill-suited or not suited to the standard protocols for measurement of the SAR.

SUMMARY

The aim of this present invention is to overcome one or more of the drawbacks of the prior art by proposing a device that provides biological protection against the electromagnetic waves emitted by a mobile telephone.

This aim is realised by a device providing biological protection against the electromagnetic waves emitted by a mobile telephone, characterised in that it includes a protective element that is proof against the electromagnetic waves, created at least in part from a highly conducting metallic material, and arranged so as to form an open, generally concave receptacle, approximately in the shape of a rectangular parallelepiped with rounded corners whose base forms a flat or slightly concave protective screen between the mobile telephone and its user, and whose periphery covering the thickness forms a protective frame of curvilinear section, with the mobile telephone being held in the concave space of the protective element by at least one retention or fixing device made from a non-conducting insulating material, positioned in the receptacle so as to maintain an electrically insulating space with a thickness of at least 2 mm between the metallic part of the protective element and the mobile telephone, with the screen and the frame being made, at least in part, from a highly conducting material and arranged so that the part of the screen made from a highly conducting material is in electrically conducting contact with the part of the frame made from a highly conducting material so as to form a whole that is proof against the electromagnetic waves and concave overall and curved so that it partially constitutes the protective element.

According to a particular feature of the device, the length of the protective element is equal to or greater than 1.15 times the length of the mobile telephone, the width of the protective element is equal to or greater than 1.2 times the width of the mobile telephone, and the depth of the protective element is equal to or greater than 1.3 times the thickness of the mobile telephone.

According to another particular feature of the device, the length of the protective element is equal to or less than 1.3 times the length of the mobile telephone, the width of the protective element is equal to or less than 1.3 times the width of the mobile telephone, and the depth of the protective element is equal to or less than 1.6 times the thickness of the mobile telephone.

According to another particular feature of the device, the electrically insulating space between the metallic part of the protective element and the ergonomic interface of the mobile telephone has a thickness between 3 mm and 8 mm.

According to another particular feature of the device, the screen and/or the frame of the protective element can include one or more orifices of a size that is less than the various wavelengths of the electromagnetic waves used in various mobile telephone standards, with this orifice or these orifices being either located opposite to the microphone and/or the loudspeaker and/or any other device included in the mobile telephone and used to receive and/or transmit acoustic waves, so that these acoustic waves are not distorted by the protective element, or located opposite to the connectors of the mobile telephone.

According to a first embodiment of the device, the screen of the protective element includes at least one gridded mesh made from a highly conducting material and with a grid pitch, either regular or not, equal to or less than 10 mm, with the highly conducting material constituting conducting lines that can have a width of 0.5 mm and with a thickness of 50 µm.

According to one particular feature of the first embodiment, the conducting gridded mesh is incorporated into or screen printed onto a membrane, or woven into an even finer mesh made from a flexible material that is transparent in the visible spectrum, so as to allow the user to see the ergonomic interface of the mobile telephone and more particularly the display screen of the mobile telephone.

According to another particular feature of the first embodiment, the slightly concave or flat screen is attached to and stretched onto the frame of the protective element, which includes at least one part made from a highly conducting metallic material at its surface or within its thickness, so that the metallic gridded mesh in part constituting the screen is in electrically conducting contact with the metallic part of the frame, so as to form a whole that is proof against the electromagnetic waves and concave overall and curved so that it partially constitutes the protective element.

According to a second embodiment of the device, the screen of the protective element includes at least one thin film.

According to one particular feature of the second embodiment, the thin film includes at least one part of its surface made from a highly conducting metallic material, deposited onto or incorporated into a membrane made from a flexible material, so that the thin film is sufficiently flexible to be rolled back onto itself.

According to another particular feature of the second embodiment, the frame of the protective element includes at least one part made from a highly conducting metallic material at its surface or within its thickness and is arranged into a functional combination with at least one blind mechanism.

According to another particular feature of the second embodiment, each blind mechanism includes a storage area dimensioned and shaped so as to be able to contain at least one blind fully wound around a roll-unroll mechanism, secured by attachment means approximately at the centre of the storage area and located in the sliding plane of the blind, and a set of two sliding rails parallel to the blind and located in the sliding plane of the blind in order to guide the movement of the blind, with the stiffness of the blind being sufficient to control the winding by raising the free end of the blind and with the storage area of the blind mechanism being integrated into the interior of one of the four sides of the periphery of the protective frame.

According to another particular feature of the second embodiment of the invention, the two sliding rails are made, at least in part, from a highly conducting material fixed onto the frame so as to create an electrically conducting contact with the metallic part of the frame, and each sliding rail is fitted with a plurality of conducting lips distributed at regular intervals over the length of the sliding rail between the legs of the U-shape formed by the sliding rail, with each conducting lip being attached in electrically conducting contact onto a first of the two legs of the U-shape and being shaped and dimensioned so as to leave a constant space between the latter and the second of the two legs of the U-shape, of a thickness that is at least equal to the thickness of the blind.

According to another particular feature of the second embodiment, the blind mechanism is arranged so that the conducting thin film that is used as the blind is able to alternatively cover and expose the ergonomic interface of the mobile telephone, with the two sliding rails, the frame and the thin film being arranged so as to ensure continuity of the electrical contact between the conducting metallic parts constituting them, so as to form a whole that is proof against the electromagnetic waves, and concave overall so that it partially constitutes the protective element, when the thin film is fully unrolled.

According to another particular feature of the second embodiment, the protective screen with the thin film includes an element of hollowed-out shape and partially complementary to the thumb of the user, fixed onto the thin film to make it easier for the user to manipulate the thin film that is used as the blind, and to play the role of a stop element to prevent the thin film from totally disappearing into the storage area for the blind mechanism.

According to another particular feature of the second embodiment, the protective frame is surmounted by a flat frame made from an insulating material that is dimensioned and shaped so that it can be attached to the protective frame between the protective screen and the user, in order to protect the blind mechanism and the protective screen that is used as the blind, while still not obscuring the view through the protective element of the ergonomic interface of the mobile telephone, and so that the thin film which is fully rolled and locked by the hollow element, coming up against the interior of the periphery of the flat frame, remains partially engaged in and between the sliding rails.

BRIEF DESCRIPTION OF THE DRAWINGS

Other particular features and advantages of this present invention will appear more clearly on reading the description that follows and that is provided with reference to the appended drawings in which:

FIG. 7 represents a view in perspective of various exploded elements that constitute in part a third embodiment of the device, FIGS. 9A and 9B represent a view in perspective of the third embodiment of the device, with the module fully covering the case, FIGS. 10A and 10B represent a view in section of the elements represented in FIGS. 8B and 9B respectively, according to the third embodiment of the device.

DETAILED DESCRIPTION

Figure 1A:
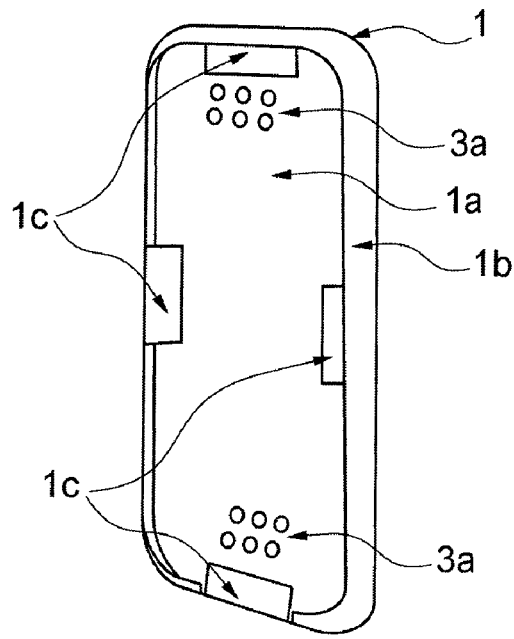
FIG. 1A represents a view in perspective of the first embodiment of the device, and more precisely the protective element that is removable from the mobile telephone, whose flat protective screen takes the form of a metallic gridded mesh woven into an even finer non-metallic mesh.

A description of the device and of its three embodiments will now be provided with reference to the figures.

This present invention proposes a device composed of at least one protective element (1) of the user against the electromagnetic waves emitted by a mobile telephone (2), an appliance with which we are familiar in all of its shapes, functions and uses. Its continuous and powerful emissions of electromagnetic waves attain their full power during a telephone communication. It is therefore during this particular type of use that the telephone is potentially most harmful, and it is also during this phase of use that the telephone is located close to or even against the head of the user in the zone extending from the mouth to one of the ears. As a consequence, it is during this period of communication that it is all the more important to protect the user.

This simple observation, associated with the method of use of a mobile telephone, allows us to illustrate why it is necessary for the protective element (1) to be arranged so that, during a wireless communication, it is located between the mobile telephone (2) and its user. In order to facilitate the comprehension of this present description, we take advantage of the fact that the protective element (1) is of more-or-less flat geometry, in order to specify two half spaces, one on either side of the plane formed by the protective element (1), and we place the mobile telephone (2) in the right-hand half space with the user in the left-hand half space.

For the user, the protective element (1) must constitute a barrier against the electromagnetic waves emitted by his or her mobile telephone. This proofing characteristic against the electromagnetic waves can be implemented only by a highly conducting material, such as copper. This is why the protective element (1) must be made, at least in part, from such a material.

If additionally the protective element (1) is concave (see FIGS. 1A, 1C, 1E and 1F) and if its concavity is orientated toward the right-hand half space (see FIG. 1B), then the electromagnetic waves emitted by the mobile telephone (2) are not only reflected by the protective element (1) into all of the right-hand half space, but they are also emitted into the right-hand half space preferably in a direction normal to the plane formed by the protective element (1), meaning in the direction away from the user. This concave shape therefore renders the protective element (1) more efficient than if it were to form a simple finished flat surface.

However, it should be noted that the protection objective of the device of this present invention can be attained only in certain conditions, of which at least two are essential.

Firstly, the concave space of the protective element (1) must be sufficiently open and/or sufficiently deep to prevent the return of the electromagnetic waves into the left-hand half space by edge effects along the periphery of the protective element (1). This is why the curvilinear section of the protective frame (1b) must have a radius of curvature that is greater than the depth of the protective element (1) and/or the depth of the protective element must be greater than the thickness of the mobile telephone, with the combination of these two characteristics being possible, unless they are mutually incompatible. Additionally, and for the same reason, the protective element (1) must be located opposite to at least one third of the thickness of the periphery (2b) of the mobile telephone (2). As a consequence, the depth dimension of the protective element (1) must be greater than one third of the thickness of the periphery (2b) of the mobile telephone (2) (see FIGS. 1C and 1E).

Secondly, the protective element (1) is composed, at least in part, of a highly conducting metallic material, as are the antennae for the transmission and reception of electromagnetic waves, so it is necessary to ensure that the protective element (1) does not function for the user as an antenna but indeed as a protective device. To this end, the protective element (1) must not capture and amplify the electromagnetic radiation emitted by the mobile telephone (2). This is why it is necessary to electrically insulate the mobile telephone (2) from the protective element (1), or more particularly from the highly conducting metallic part of the protective element. This electrical insulation is created and ensured by maintaining a space of at least 2 mm (see FIG. 1C) everywhere between the mobile telephone (2) and the metallic part of the protective element (1). It should be noted that, with a space of 0.5 mm for instance between the ergonomic interface of the mobile telephone and the metallic part of the protective element, the metallic part of the protective element conducts, or even accentuates, the electromagnetic waves transmitted and/or received by the mobile telephone. An upper limit for the possible values of the electrically insulating space between the ergonomic interface of the mobile telephone and the metallic part of the protective element can be provided. This upper limit is fixed to 10 mm. This choice is uniquely dictated by the desire to maintain a set formed by the mobile telephone and its protective element which is mobile and has a suitable size and aesthetics. Preferentially, the electrically insulating space between the mobile telephone and the metallic part of the protective element is everywhere of a value comprised between 3 mm and 8 mm.

As a consequence, the length and width dimensions of the protective element (1) must be greater than the length and width dimensions of the mobile telephone (2). As a further consequence, the depth dimension of the protective element (1) must be at least equal to one third of the thickness of the periphery (2b) of the mobile telephone (2) to which it is added the electrically insulating space between the ergonomic interface of the mobile telephone and the metallic part of the protective element situated opposite to said ergonomic interface (see FIGS. 1C and 1E).

In the case of continuous or discontinuous metallization on an electrically insulating substrate with a determined thickness, the electrically insulating space between the ergonomic interface of the mobile telephone and the metallic part of the protective element corresponds to the space between the ergonomic interface of the mobile telephone and the substrate to which it is added the determined thickness of the substrate. The choice of a protective element more or less open and/or more or less deep and the choice of an electrically insulating space between the ergonomic interface of the mobile telephone (2) and the metallic part of the protective element (1) of a particular value of at least 2 mm are preferentially dependent to one another. Many scientific tests of protective performance of the protective element have been made. They show that the two basic conditions listed above are mutually linked relatively to the basic functional capabilities of transmission/reception of the mobile telephone.

Firstly, for a mobile telephone (2) and a protective element (1) fixed in shape and size, it can result from a small space between them, for example less than 2 mm, a malfunction and/or loss of significant performance of the mobile telephone for these basic functional capabilities of transmission/reception, with this disadvantage being largely reduced since the electrically insulating area reaches a value of at least 3 mm.

Secondly, for the same electrically insulating space between the mobile telephone and the metallic part of the protective element, the deeper the protective element relatively to the thickness of the mobile telephone, the more significant the dysfunction and loss of performance of the mobile telephone. As the telephone delivers signals of greater power to maintain the quality of transmissions, an overheating and/or premature discharge of the battery, or more generally a reduction of its autonomy, can then be observed. The quality of the protection against electromagnetic waves emitted by the mobile telephone is, as for it, slightly affected by the variation of these parameters and is satisfactory within the limits defined in this application.

The choice of a protective element sufficiently open and/or sufficiently deep and the choice of a value of at least 2 mm, preferably between 3 mm and 8 mm, for the electrically insulating space between the ergonomic interface of the mobile telephone and the metallic part of the protective element must therefore correspond to finding a compromise between the quality of the provided protection and the quality of telephonic communications. Moreover, the desire to retain a set, formed by the mobile telephone and the protective element, which is mobile and aesthetic, imposes a minimum bulk. To this end, it is specified an electrically insulating space of 10 mm maximum, preferably of 8 mm maximum.

The following ranges of values are specified and given as a purely non-limiting example. The length of the protective element is equal to or greater than 1.15 times the length of the mobile telephone, the width of the protective element is equal to or greater than 1.2 times the width of the mobile telephone, and the depth of the protective element is equal to or greater than 1.3 times the thickness of the mobile telephone. The length of the protective element is less than or equal to 1.3 times the length of the mobile telephone, the width of the protective element is less than or equal to 1.3 times the width of the mobile telephone and the depth of the protective element is less than or equal to 1.6 times the thickness of the mobile telephone. The dimensions of the protective element relatively to the dimensions of the mobile telephone are to be defined on an individual basis within the ranges of the referred values, in order to maximize the provided protection, while minimizing the bulk of the protective element and the relative performance degradation related to the use of the mobile telephone with the protective element.

Due to its proofing to the electromagnetic waves, the protective element (1) must not fully cover the mobile telephone (2) since this would render impossible any communication protocol requiring the emission and/or reception by the mobile telephone of electromagnetic waves to and/or from the exterior respectively. This is why the protective element (1) is open, and the bottom of the concave space is positioned opposite to the ergonomic interface of the mobile telephone (see FIGS. 1C and 1E).

This characteristic of the protective element (1) renders its design easier and its versatility broader. In fact since it is not a closed box but rather an open receptacle, the protective element (1) is constrained in dimension and in shape by the dimensions and the shape of the face of the mobile telephone (2) that includes the ergonomic interface (2a), and of the periphery covering the thickness (2b) of the mobile telephone (2), but is not constrained by the dimensions or the shape of the face of the mobile telephone (2) away from the ergonomic interface (2a).

In the three embodiments of the protective device according to the invention, the protective element appears as a rectangular parallelepiped opened at one of its bases to form a generally concave and curved receptacle. The corners and edges of said rectangular parallelepiped are preferably not prominent but rounded or bevelled. This feature is introduced to provide a protective device that is aesthetic, but also to ensure and increase the concave aspect of the protective element, and therefore the quality of the provided protection. Thus, man skilled in the art will understand that it does not matter, for example, that the non-metallic part of the protective element has rounded or bevelled corners, but it is important that the metallised part of the protective element has rounded or bevelled corners. For example, in the case of a metallization of the protective element on the outer surface of a substrate made from insulating material and shaped like a rectangular parallelepiped, it does not matter that the inner corners and edges of the parallelepiped are rounded or bevelled, since the latter being made from insulating material and then having no shielding characteristic against the electromagnetic waves. Instead, it is important that the outside corners and edges of the parallelepiped are rounded or bevelled, as they represent or support the metallization of the shielding of the external surface of the parallelepiped.

In the three embodiments of the device of this present invention, the attachment or the insertion of the mobile telephone (2) to or into the protective element (1) is the responsibility of the user. If the protective element (1) covers the face away from the ergonomic interface (2a) so that the concave space of the protective element (1) is orientated toward the user, then the protective element (1) will increase the specific absorption rate received by the user. In fact the electromagnetic waves emitted by the mobile telephone (2) would then converge toward the user thus increasing exposure in relation to use of the mobile telephone (2) with no protective element (1). In order to deal with this eventuality, and to eliminate all risk for the user, this present invention proposes that each embodiment of the device includes design characteristics that work in the manner of a safety feature, preventing the user from placing the protective element (1) on the mobile telephone so that the protective screen is opposite to the face away from the ergonomic interface (2a).

In the three embodiments of the device, the protective element (1) can include one or more orifices (3a) (see FIG. 1A) of a characteristic size less than the various wavelengths of the electromagnetic waves used in the various mobile telephone standards, for instance less than 1 cm. Imposing a limit that is greater than the characteristic size of the orifices (3a) ensures that the latter do not reduce the quality of the protection of the protective element (1) from electromagnetic waves. For example, an electromagnetic wave with a frequency of 30 GHz has a wavelength of 1 cm, while mobile telephones emit electromagnetic waves with a frequency of about 1 GHz corresponding to a wavelength of around 30 cm. For example, some orifices (3a) are located opposite to the loudspeaker and the microphone of the mobile telephone (2) or more generally opposite to any device on the mobile telephone (2) emitting or receiving acoustic waves. This placement of the orifices (3a) is desirable in order to prevent and avoid any alteration of the transmission quality of the acoustic waves between the user and the mobile telephone (2). Furthermore, some orifices are located for example opposite to the connectors of the mobile telephone, in order to allow the user to reach the connectors (2c).

Generally speaking, the idea presented in the different embodiments is to allow the user to obtain protection from the electromagnetic waves emitted by his or her mobile telephone (2) whenever so desired.

FIGS. 1A to 2B illustrate the first embodiment of the device of the invention which will now be described.

FIG. 1A shows the protective element (1) in the first embodiment of the device. Here, the protective element (1) appears as an open, generally concave receptacle, approximately in the shape of a rectangular parallelepiped. Since this is not manufactured as a single part, it is convenient to break down the protective element (1) into its two homogeneous parts, namely the screen (1a) approximately forming the base of the rectangular parallelepiped, and the frame (1b) approximately forming the periphery covering the thickness of the rectangular parallelepiped.

Figure 2A:
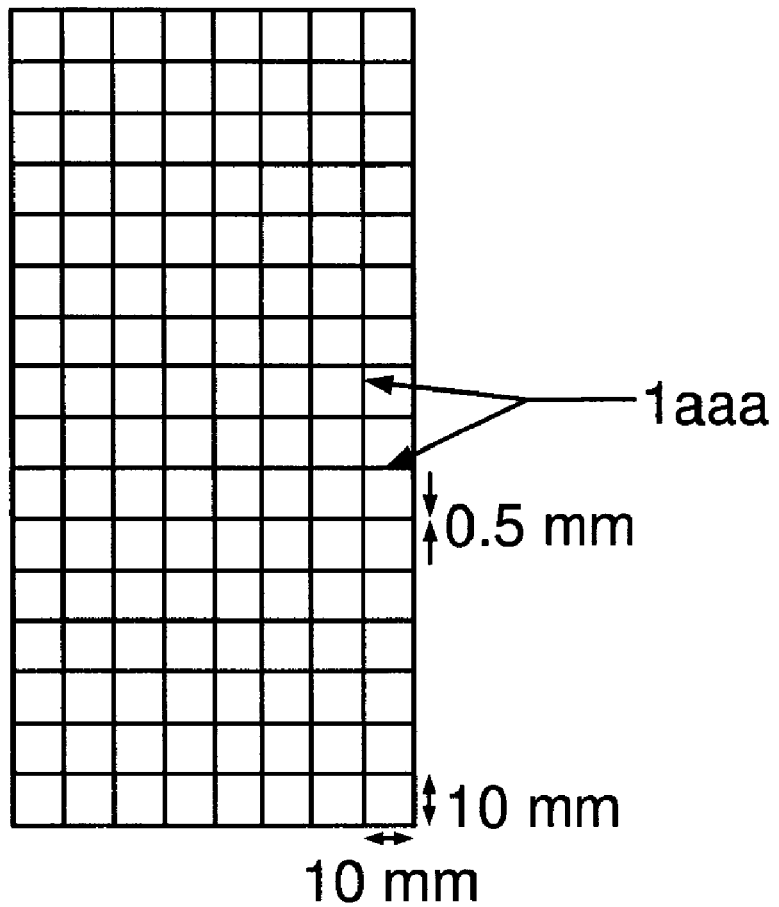
Figure 2B:
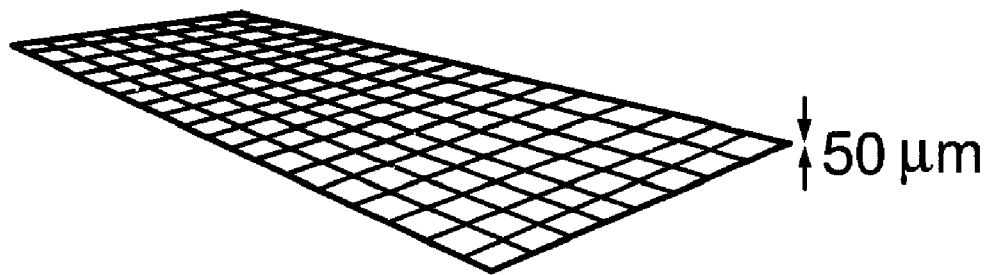

In the first embodiment, and as illustrated in FIGS. 2A and 2B, the screen (1a) is composed in part of a highly conducting metallic gridded mesh (1aa). This metallic gridded mesh (1aa) has a regular grid pitch of 10 mm by 10 mm, and its conducting lines (1aaa) have a width of 0.5 mm. Such a metallic gridded mesh (1aa) constitutes a barrier against electromagnetic waves with a frequency of less than 3 GHz, while the electromagnetic waves emitted by mobile telephones are at about 1 GHz, corresponding to a wavelength λ of 30 cm. Openings of the order of λ/30 are permitted without altering the effects sought. As a consequence, this embodiment of the screen (1a) of the protective element (1) constitutes a barrier that is very effective over a frequency band of the electromagnetic waves which is wider than that used by most of the mobile telephones currently on the market.

This metallic gridded mesh (1aa) is fragile however, and in order to ensure the long-term efficiency of this protection, the invention proposes to incorporate it into, or to apply it by screen printing onto, a more robust support like a membrane, or to weave it into an even finer mesh.

The screen (1a) thus constituted is attached to and stretched onto a frame (1b) (see FIG. 1A) that includes at least one part made from highly conducting metallic material at its surface or within its thickness, so that the metallic part of the screen (1a) is in electrically conducting contact with the metallic part of the frame (1b) or spaced of at least 5 mm from the metallic part of the frame, in order to form a protective element (1) as a single part, generally concave and entirely proof against the electromagnetic waves.

It should be noted here that in all shown embodiments, the electrical continuity between the protective frame and the protective screen is preferentially ensured. However, due to the fact that mobile telephones emit electromagnetic waves with a frequency of about 1 GHz corresponding to a wavelength of about 30 cm, discontinuities in certain physical locations, such as holes in the order of 1 cm, are possible while maintaining electrical continuity between the frame and the screen without impairing the quality of protection provided by the device of the invention. In the same way, an electrical discontinuity between the metallic part of the frame and the metallic part of the screen is possible if it is realized by a physical discontinuity between the metallic part of the frame and the metallic part of the screen, the size of which is inferior, for example at least of a coefficient of 10, to the various wavelengths of the electromagnetic signals used in various mobile telephone standards, preferentially less than 5 mm.

Figure 1B:
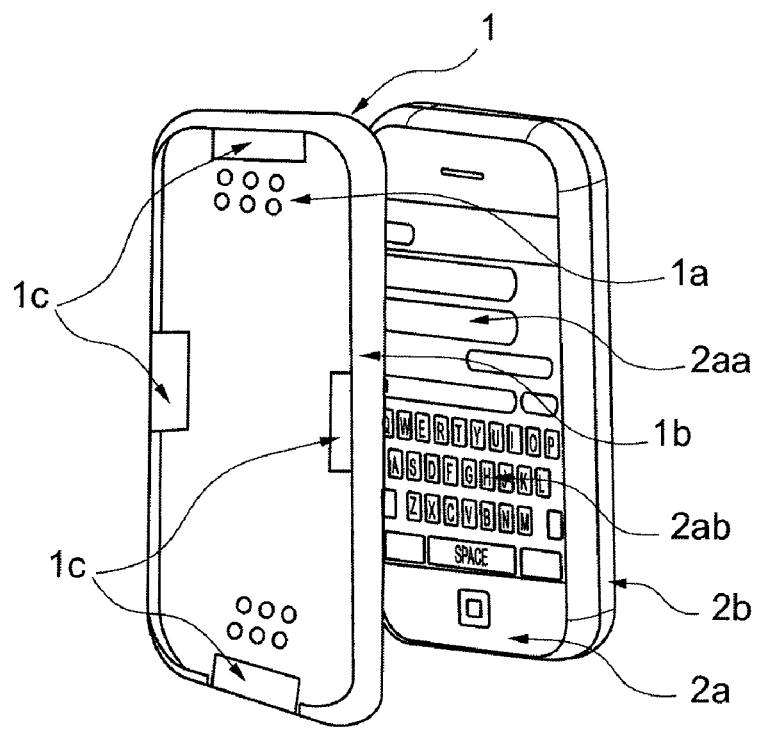
FIG. 1B represents a view in perspective of the first embodiment of the device and the correct direction of attachment of this implementation of the device on a mobile telephone, with the protective screen covering the ergonomic interface of the mobile telephone, FIGS. 1C to 1E schematically represent a variant of the first embodiment in which the protective element is hinged onto a receptacle made from a plastic material, by a flap mechanism, and is located in a first of its two stable positions.
Figure 1C:
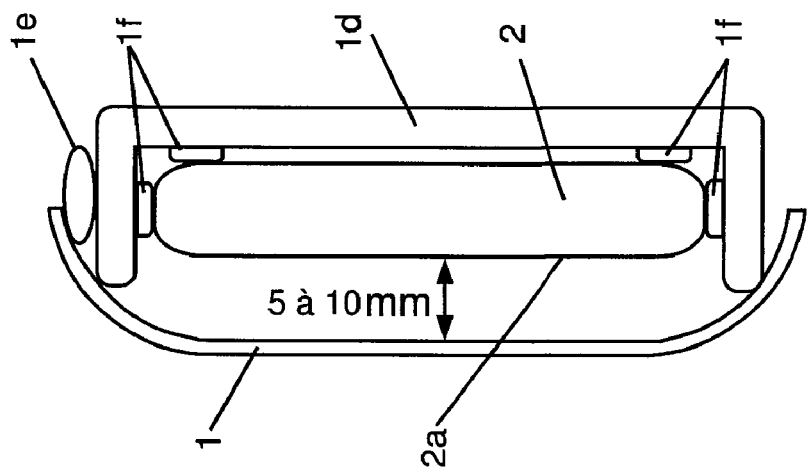
FIG. 1C shows a view in section of the profile of this variant.
Figure 1D:
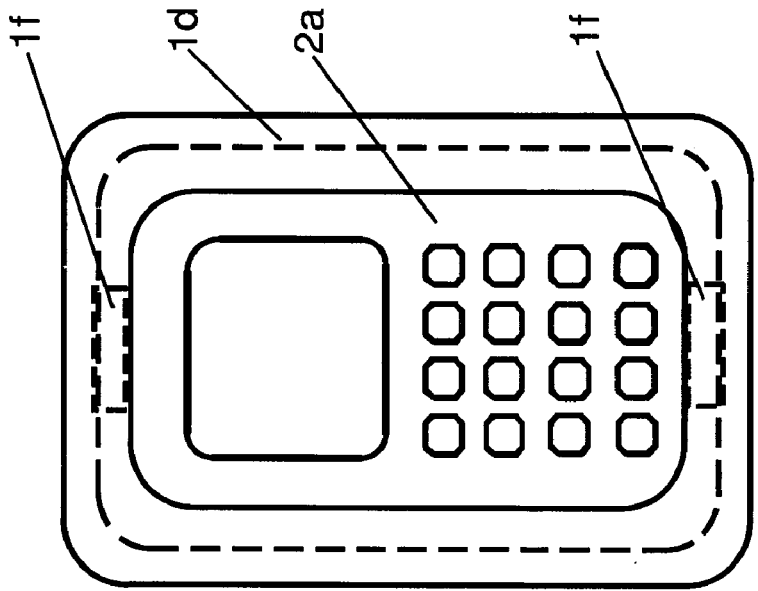
FIG. 1D shows a front view of this variant without the protective element.
Figure 1E:
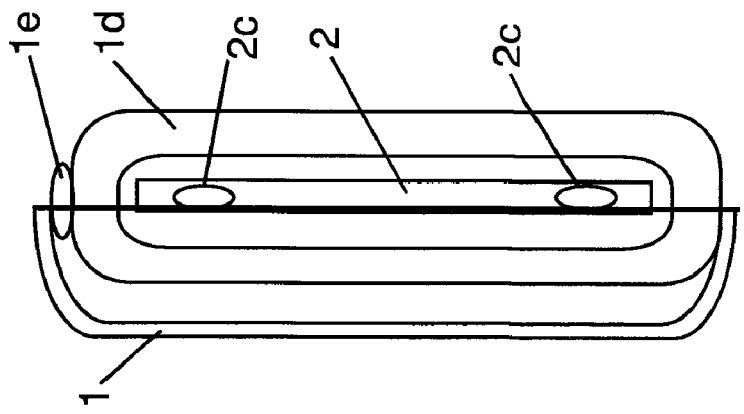
FIG. 1E shows the profile of this variant, FIG. 1F relates to the variant of the first embodiment and schematically represents the protective element in the second of these two stable positions, with the protective element being raised to allow the user to reach the ergonomic interface of the mobile telephone, FIGS. 2A and 2B schematically represent a front view and a view in perspective of the metallic gridded mesh and the respective dimensions.

As illustrated in FIGS. 1B, 1C and 1E, the protective element (1) according to the first embodiment is located opposite to the ergonomic interface (2a) of the mobile telephone and covering at least part of the thickness of the periphery of the mobile telephone (2). It must however allow the user to see the ergonomic interface (2a), composed of a screen (2aa) associated with a physical or virtual keyboard (2ab) (see FIG. 1B). This is why, according to the invention, the metallic mesh (1aa) has a thickness of 50 μm only, and the support of the metallic gridded mesh must be transparent in the visible spectrum.

In order to increase the effectiveness of the protective element of the first embodiment, it is conceivable that the shape of the screen (1a) should differ slightly from that of a plane, to take a slightly concave shape whose concavity is obviously oriented in the same direction as the concavity of the protective element (1).

In this first embodiment, the protective element (1) is removable from the mobile telephone (2) and is secured by at least one clip-type attachment device (1c), fixed onto the inner periphery of the protective frame (1b) and made from insulating material so that an electrically insulating space with a thickness of at least 2 mm is maintained everywhere between the ergonomic interface of the mobile telephone (2) and the metallic part of the protective element (1).

In a variant of the first embodiment, schematically illustrated in FIGS. 1C to 1F, the protective element (1) is hinged by means of a flap mechanism (1e) onto an open and generally concave receptacle (1d), made from a non-conducting plastic material, of shape and dimensions designed so as to form a container for the mobile telephone (2), with the mobile telephone (2) being held in its receptacle (1d) by an insulating material, for instance by adhesive foam (1f), applied at several points of contact between the mobile telephone (2) and the receptacle (1d), and the ergonomic interface (2a) of the mobile telephone being orientated toward the open side of the receptacle (1d) (see FIG. 1D in particular).

This variant of the first embodiment has several advantages.

Firstly, the flap mechanism is not very expensive. It is created, for example, from a leaf spring.

Secondly, it allows the protective element (1) to assume two stable positions located at the two ends of its rotation trajectory about the axis determined by the flap mechanism (1e), for example located on the periphery of the receptacle (1d) closest to the loudspeaker of the mobile telephone (2).

As represented schematically in FIG. 1E, a first stable position is a position of the metallic part of the protective element facing and at a distance of at least 2 mm (see FIG. 1C) from the ergonomic interface (2a) of the mobile telephone (2), with the concavity of the protective element (1) being oriented in a direction away from the concavity of the receptacle (1d) and the leaf spring of the flap mechanism (1e) continuously pressing the protective element up against the periphery of the receptacle (1d). This first stable position therefore represents the position for protection of the user during a communication.

Figure 1F:
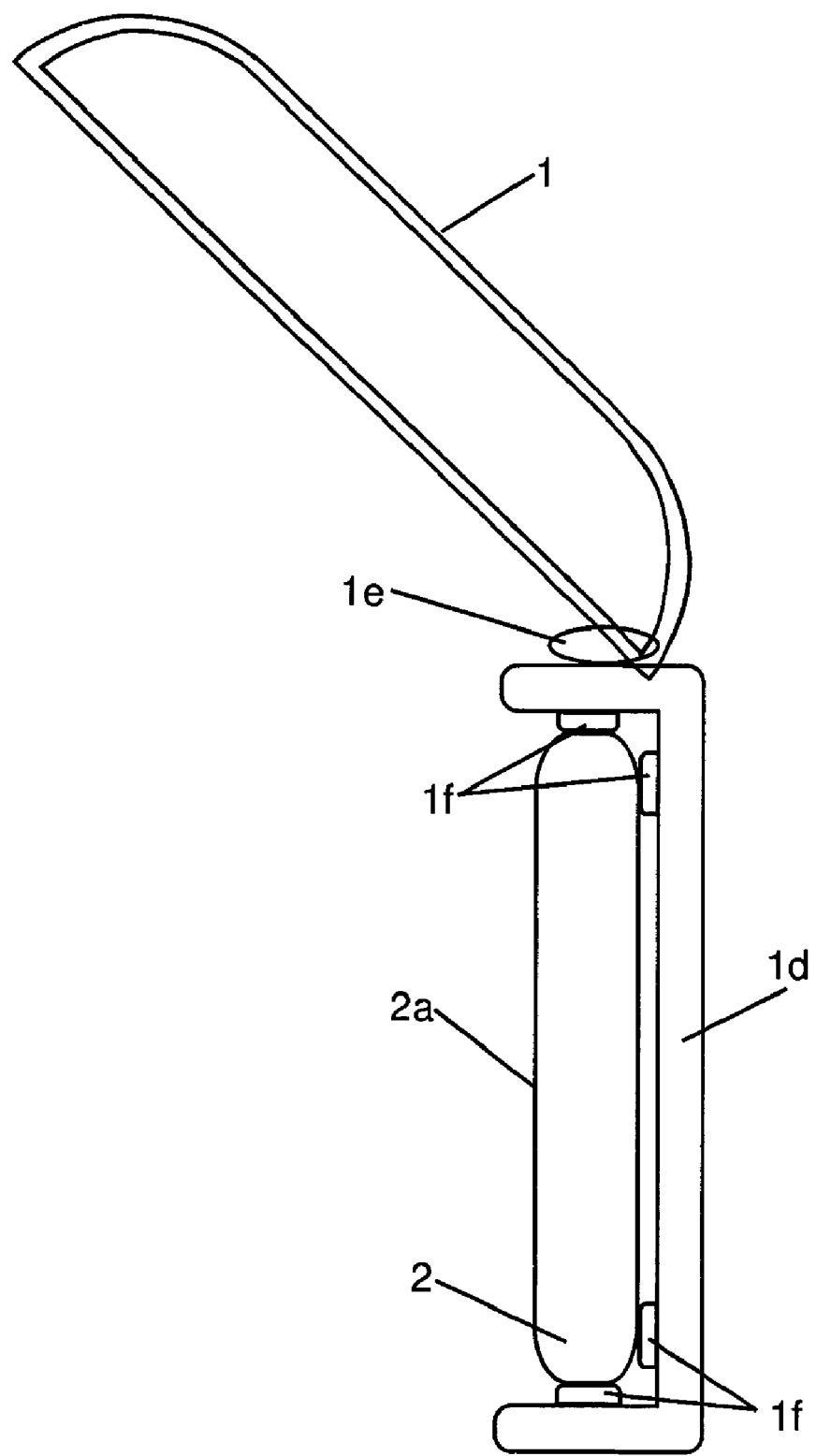

As represented schematically in FIG. 1F, a second stable position of the protective element is a position in which the protective element is raised above the mobile telephone (2) and forms an angle with the mobile telephone (2) affixed to the receptacle (1d), of the order of 140 to 170°, sufficient to allow the user to reach the ergonomic interface of the mobile telephone (2) without being hindered by the protective element (1). This second position allows the user to reach the functions of the mobile telephone (2) provided by the manufacturer on its ergonomic interface (2a).

Between these two stable positions, the protective element (1) is in an unstable state, so that under pressure from the leaf spring of the flap mechanism (1e), and at an angle with the mobile telephone, it moves to one or the other of these two stable positions.

Thus, the user can raise the protective element into its second stable position for long enough, for example, to key a subscriber number or to answer an incoming call, and then, by a simple operation that rotates the protective screen (1) by a few tens of degrees about its axis of rotation, toward the ergonomic interface, so that the latter switches to its protection position, the user can then communicate while being shielded by its protective element (1) from the electromagnetic waves emitted by the mobile telephone (2).

Thirdly, as in the other embodiments, this variant of the first embodiment is equipped with a safety feature, in the sense that the bottom of the receptacle (1d) is opaque. And the user, wanting to be protected while not being deprived of the functions of the mobile telephone (2), and particularly those accessible via the ergonomic interface (2a), is unable to use the mobile telephone (2) by orienting its ergonomic interface (2a) toward the opaque bottom of the receptacle (1d).

Fourthly, as schematically illustrated in FIG. 1E, the periphery of the receptacle (1d) is cut away in part in order to allow the user to reach the connectors (2c) of the mobile telephone, at least when the protective element is raised.

FIGS. 3A to 6 schematically illustrate the second embodiment of the device.

FIGS. 7 to 12C schematically illustrate the third embodiment of the device.

According to the second and third embodiments of the device, and as illustrated in FIGS. 3A, 3B, 4A, 4B and 5, the protective element (1) is composed of at least one thin film (1ab), consisting of a continuous or discontinuous metallization of its surface, with said metallization being deposited onto, or incorporated into, a membrane made from a flexible material so that the thin film (1ab) thus formed is sufficiently flexible to be rolled back onto itself, with the protective element being furthermore composed of a protective frame (1b). These two parts of the protective element (1) are functionally combined with a blind mechanism (4), including a storage area (4a) that is equipped with a roll-unroll mechanism (4b) and two sliding rails (4c) equipped with conducting lips (4d), with the thin film (1ab) being used as the blind and being for example associated with a spiral spring (not shown) that can be used to control the winding of the thin film (1ab).

Figure 8B:
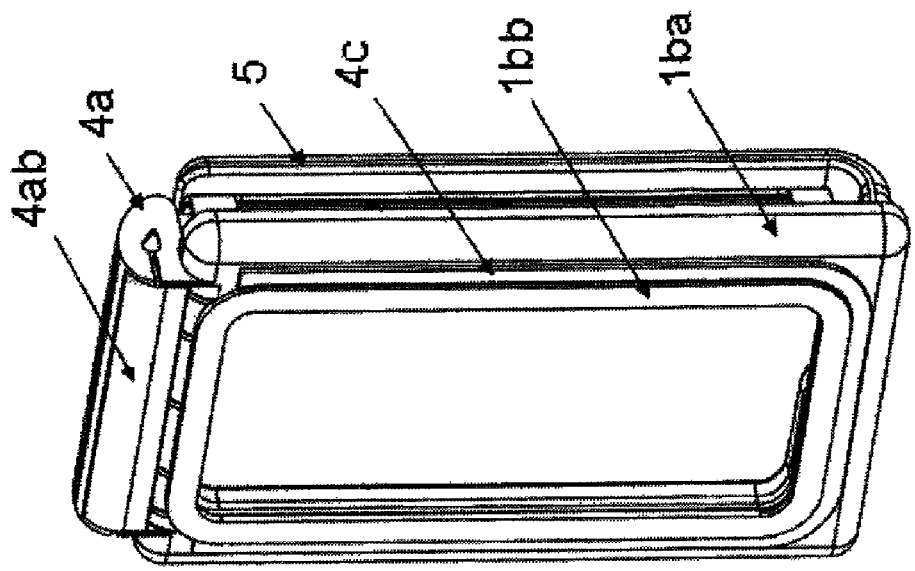
FIGS. 8A and 8B represent a view in perspective of different fitted elements constituting in part the third embodiment of the device.
Figure 8A:
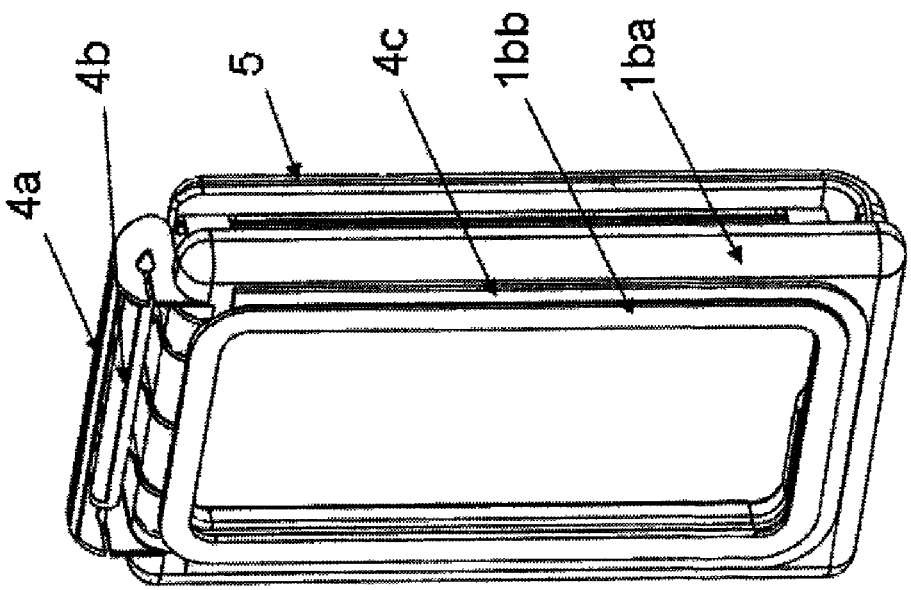

The storage area (4a) for the blind mechanism is incorporated into, or positioned on, one of the four sides of the periphery of the frame (1b) of the protective element (1). As illustrated in FIGS. 3B, 4A, 4B and 5, the storage area is integrated into the interior of the periphery of the frame (1b) of the protective element (1) that is located closest to the loudspeaker of the mobile telephone (2). As illustrated in FIGS. 7, 8A and 8B, the storage area is positioned on the side of the periphery of the frame (1b) of the protective element (1) that is located closest to the loudspeaker of the mobile telephone (2). In both cases, the storage area (4a) of the blind mechanism is designed to accommodate the thin film (1ab) that is used as the blind, rolled around the roll-unroll mechanism (4b), located approximately in the middle of the storage area (4a) in the sliding plane of the blind, with the sliding plane of the blind being defined as a plane parallel to, and distant of at least 2 mm from the ergonomic interface (2a).

In the second embodiment, the frame (1b) is composed of a single part, as in the first embodiment of the device. But in the third embodiment (see FIG. 7), the frame (1b) has two parts, each made, at least in part, from a highly conducting metallic material, the first having the shape of the frame (1ba), as described previously and the second having the shape of a frame (1bb) of plane section and of length and width dimensions slightly less than the length and width dimensions of the frame (1ba).

Figure 3A:
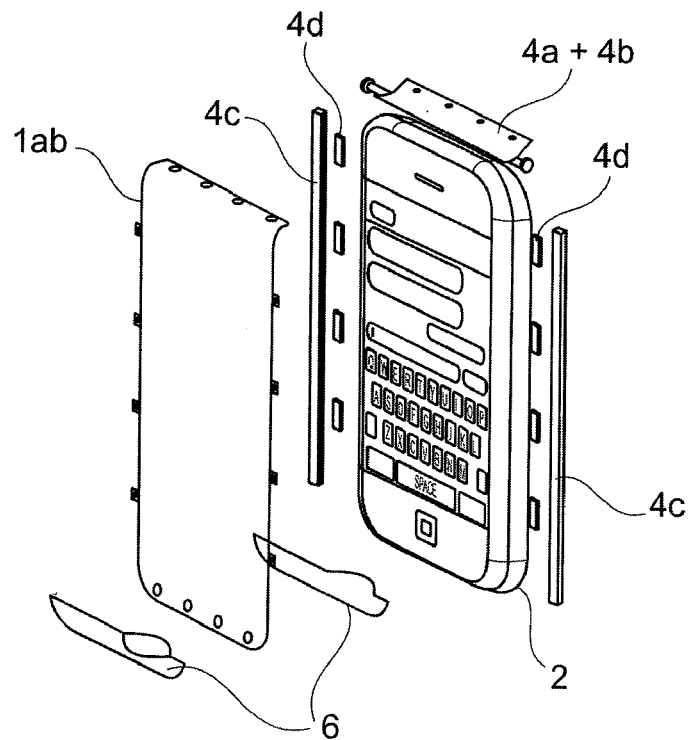
FIGS. 3A and 3B represent a view in perspective of different exploded elements constituting the second embodiment of the device.
Figure 3B:
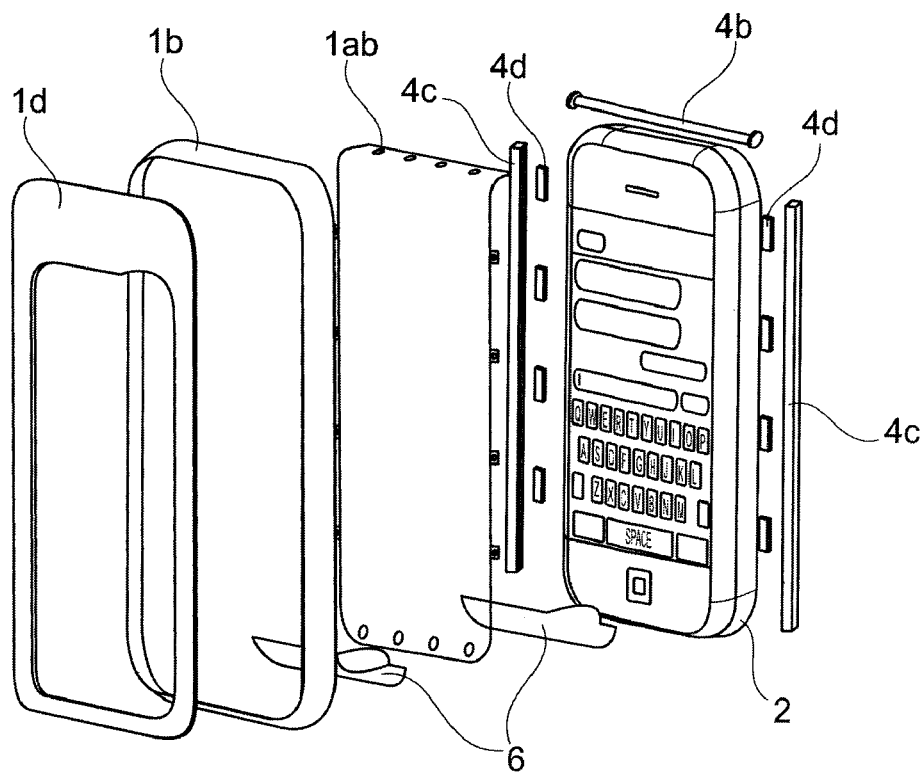
Figure 4A:
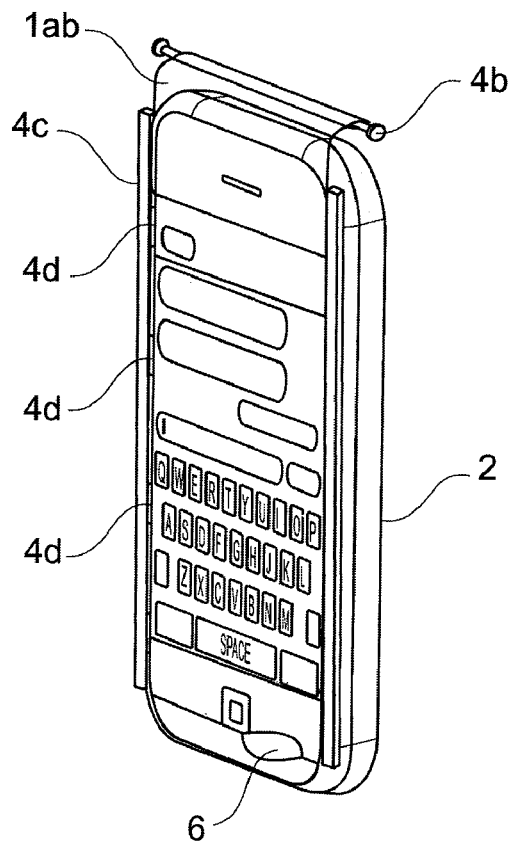
FIGS. 4A and 4B represent a view in perspective of the thin film unrolled from in front of the ergonomic interface of the mobile telephone, with the sliding of the thin film being guided by the sliding rails, and conducting lips being positioned so as to ensure continuity of the electrically conducting contact between the thin film and the metallic part of the sliding rails.
Figure 4B:
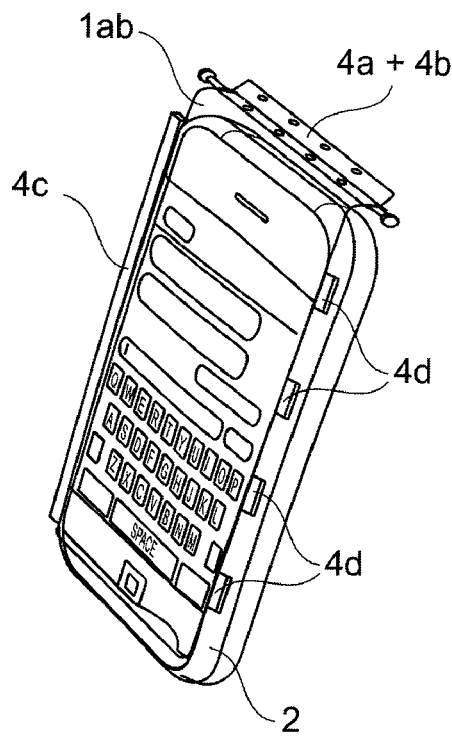

The sliding rails (4c) are located in the sliding plane of the blind, and are attached in electrically conducting contact at least to a metallic part of the protective frame (1b). In the second embodiment, and as illustrated in FIG. 3B, the sliding rails (4c) are fixed to the interior and within the thickness of the periphery of the frame (1b). In the third embodiment, and as illustrated in FIG. 7, the sliding rails (4c) are fixed to the frame (1bb) of plane section.

Figure 5:
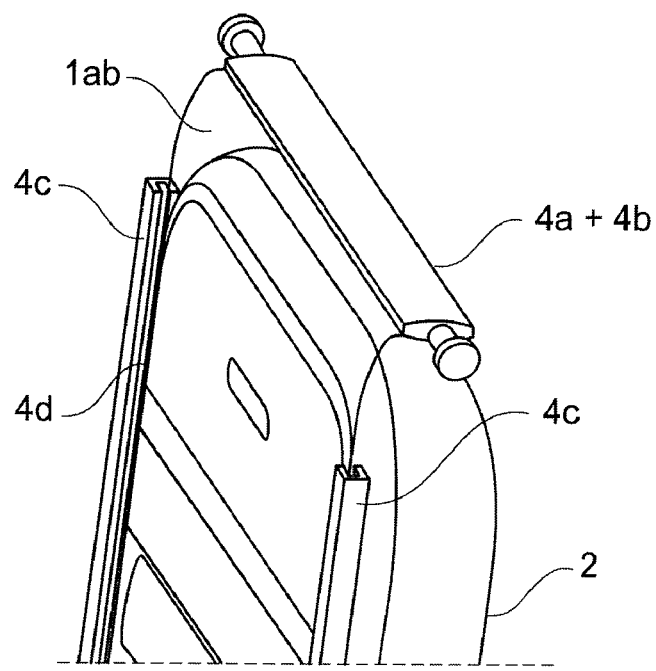
FIG. 5 represents a view in perspective showing a magnification of the storage area for the blind mechanism located in the periphery of the frame (not shown) close to the loudspeaker of the mobile telephone in a variant of the second embodiment of the device.

In the second and third embodiments, and as illustrated in FIG. 5, conducting lips (4d) are positioned at regular intervals and attached in electrically conducting contact in each sliding rail (4c), so that the thin film (1ab) that is used as the blind is gripped between the conducting lips (4d) and one of the two legs of the sliding rail (4c), so as to ensure an electrically conducting contact between the thin film (1ab) and each sliding rail (4c).

In the second and third embodiments (see FIGS. 6, 9B and 11A), an element (6) of hollowed-out shape, and partially complementary to the thumb, is fixed onto the width of the thin film (1ab), in order to make it easier for the user to manipulate the thin film (1ab) that is used as the blind, and to play the role of a stop element to prevent the thin film (1ab) from disappearing totally into the storage area (4a) for the blind mechanism.

According to the second and third embodiments of the device (see FIGS. 5 and 11A), the thin film (1ab) is partially transparent in the visible spectrum, so as not to obscure the view of the ergonomic interface (2a).

Figure 6:
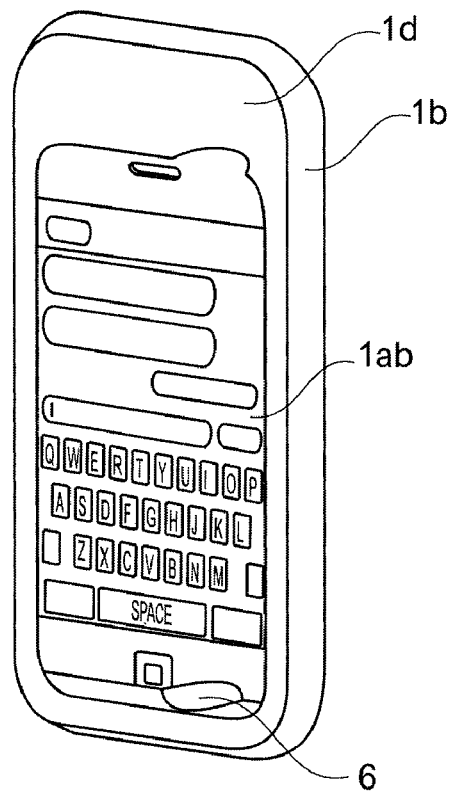
FIG. 6 represents a view in perspective of the second embodiment of the device fully fitted and positioned by clip-type devices so as to be removable, on the ergonomic interface of the mobile telephone, with the thin film being fully unrolled.

In the second embodiment of the device, and as illustrated in FIG. 6, a frame (1d) made from rigid insulating material, such as plastic for example, surmounts the protective frame (1b), firstly, so as to protect the blind mechanism and, secondly, so that the fully rolled thin film (1ab) in the storage area (4a) for the blind mechanism remains partially engaged in and between the two sliding rails (4c), by virtue of the hollow element (6) that is partially complementary to the thumb, playing the role of a stop element against the frame (1d).

In the second embodiment, the protective element (1) is removable from the mobile telephone (2), and is secured by at least one clip-type attachment device (1c) made from insulating material, so that an electrically insulating space with a thickness of at least 2 mm is maintained everywhere between the mobile telephone (2) and the metallic part of the protective element (1).

Figure 15:
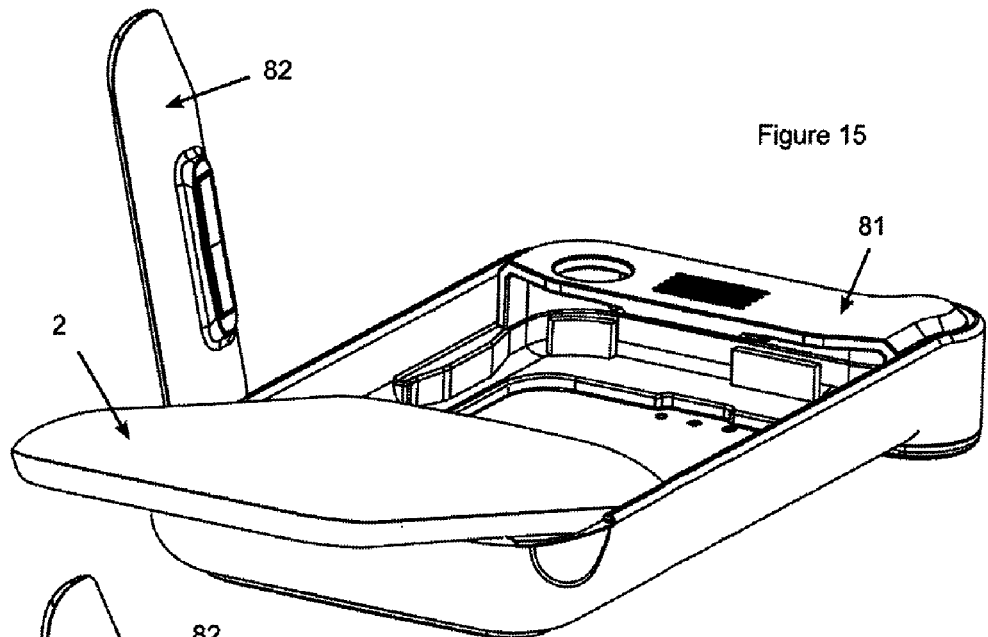
FIGS. 15 to 17 represent an embodiment of the invention in which the attachment device of the mobile telephone in the depth of the protective element has two closure bars situated opposite to the protective screen with respect to the protective frame, and illustrate more particularly the manner according to which the mobile telephone is inserted in, or removed from, the protective element.
Figure 16:
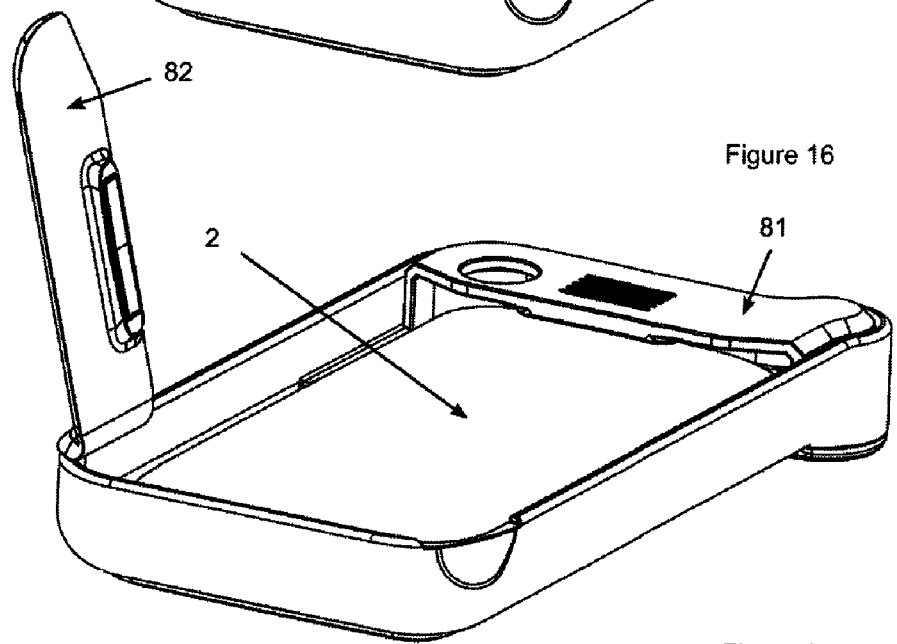
Figure 17:
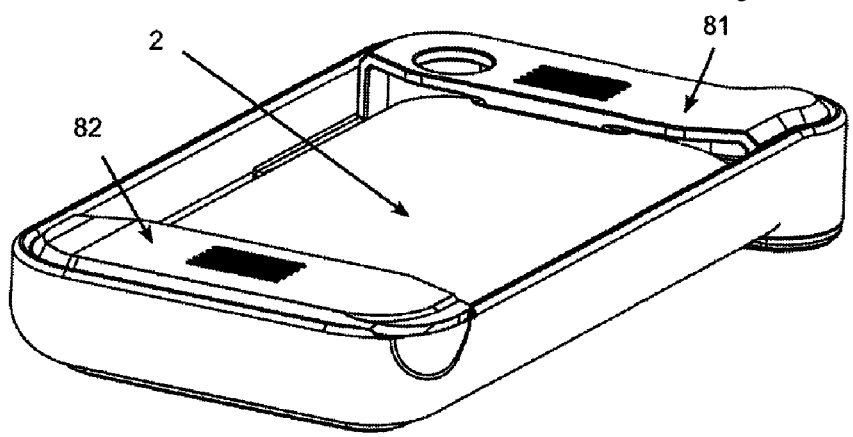

In the embodiments illustrated by at least FIGS. 1A, 1B, and 3A to 6, the protective element is removable from the mobile telephone (2) and this latter is for example maintain in the depth of the protective element by an attachment device made from a non-conducting, insulating material, plastic or elastomeric, which is composed of two closure bars. In this example illustrated on FIGS. 15 to 17, the two closure bars are mounted on the protection frame in the opposite to the protective screen with respect to the protective frame. In other words, in this example, the two closure bars are located in the back of the mobile telephone when the mobile telephone is placed within the depth of the protective element, the ergonomic interface of the mobile telephone being located opposite to the protective screen. For example, one (61) of the two closure bars is mounted in the top of the protective frame and the other (62) of the two closure bars is mounted in the bottom of the protective frame. One of the two closure bars is for example fixed, for example by clipping, to the protective frame. The other of the two closure bars is for example articulated on the periphery of the frame for example by one of its ends, with the other of its ends then enabling to engage the protective frame. For example, the articulation is an articulation of pivot type and the articulated closure bar pivots around the axle of the pivot link in the manner of a door. For another example, the articulation is an articulation enabling a sliding movement on the side of the articulated closure bar in the manner of a sliding. The engagement is ensured by a bolting/unbolting device, for example of the type of a latch, well-constructed in part in the said end of the closure bar opposite to the end articulated on the frame and in part in the intern periphery of the frame. Thus, the articulated closure bar can be pivoted or slid by the user from a position of closure towards a position of opening in order to facilitate for herself or himself the insertion of the mobile telephone into, or the removal of the mobile telephone from, the protective element.

In the third embodiment and as illustrated in FIGS. 7, 8A and 8B, the blind mechanism (4) and the protective element (1) are arranged so as to fit onto a hollow element (5) of shape and dimensions designed so as to form a container that can be used to accommodate the mobile telephone (2). The hollow element (5) is made from an electrically insulating material, and the thickness of the material of which it is made must be sufficient so that the metallic part of the protective element (1) fixed onto the hollow element (5) is separated from the ergonomic interface of the mobile telephone (2) by an electrically insulating space with a thickness of at least 2 mm.

In order to meet these objectives, the hollow element (5) (see FIG. 7) is approximately in the shape of a regular parallelepiped, with non-projecting rounded corners whose length and width dimensions are less than the length and width dimensions of the protective element (1) and greater than the length and width dimensions of the mobile telephone (2), and whose depth dimension is greater than the thickness of the mobile telephone (2) (see FIGS. 10A and 10B). Additionally, the base of the parallelepiped, to which at least one part of the protective element (1) is attached, is cut away, the face away from the cut-away face is solid, and the periphery covering its depth is cut away on three of its sides. As illustrated in FIGS. 10A and 10B, since the fourth side is solid, the hollow element (5) more particularly forms a structure whose view in section along the width of the hollow element (5) is U-shaped, with the bottom of the U being formed by the solid side of the periphery of the hollow element (5), and the legs of the U being formed by the two opposing faces of the hollow element (5).

Figure 11B:
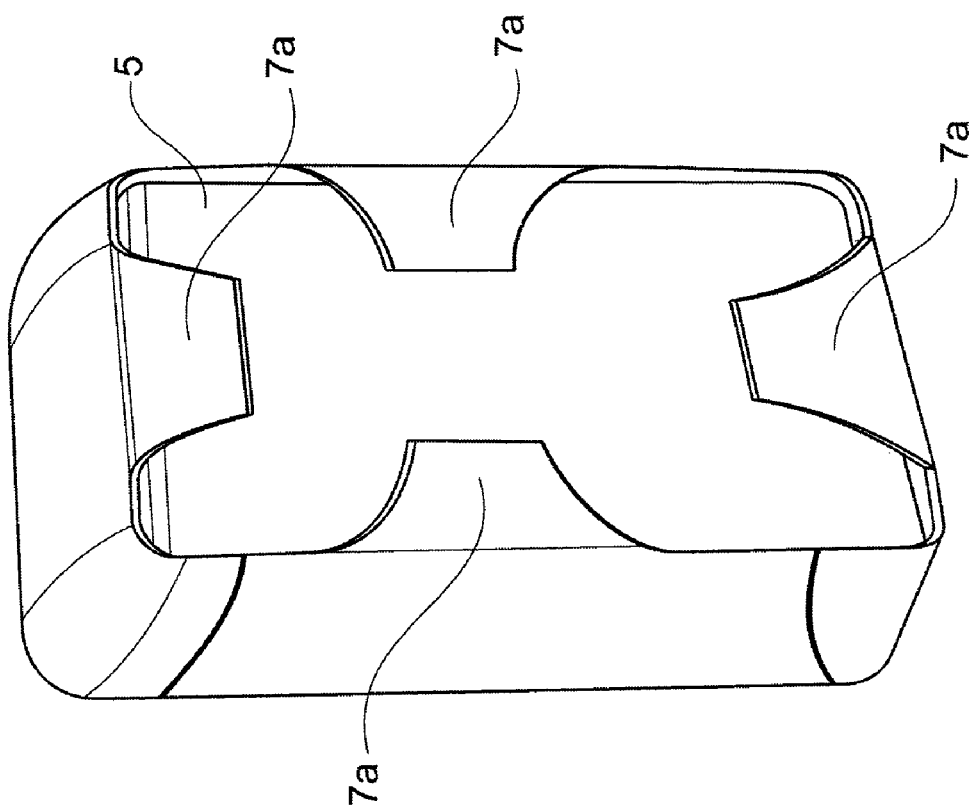
FIGS. 11A and 11B represent a view in perspective of the module closed onto the case, with face and back respectively according to the third embodiment of the device, the module being held by tabs folded onto the back of the case.
Figure 11A:
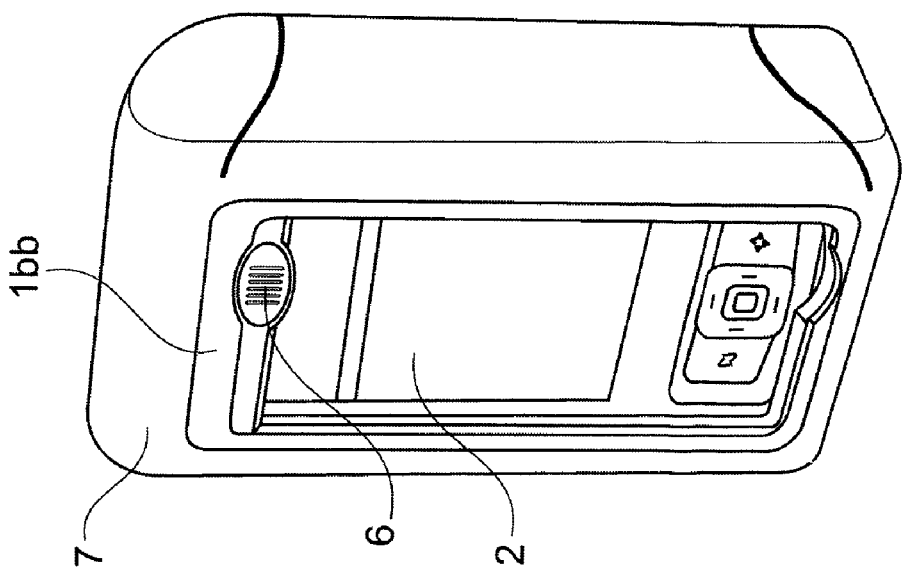
Figure 12A:
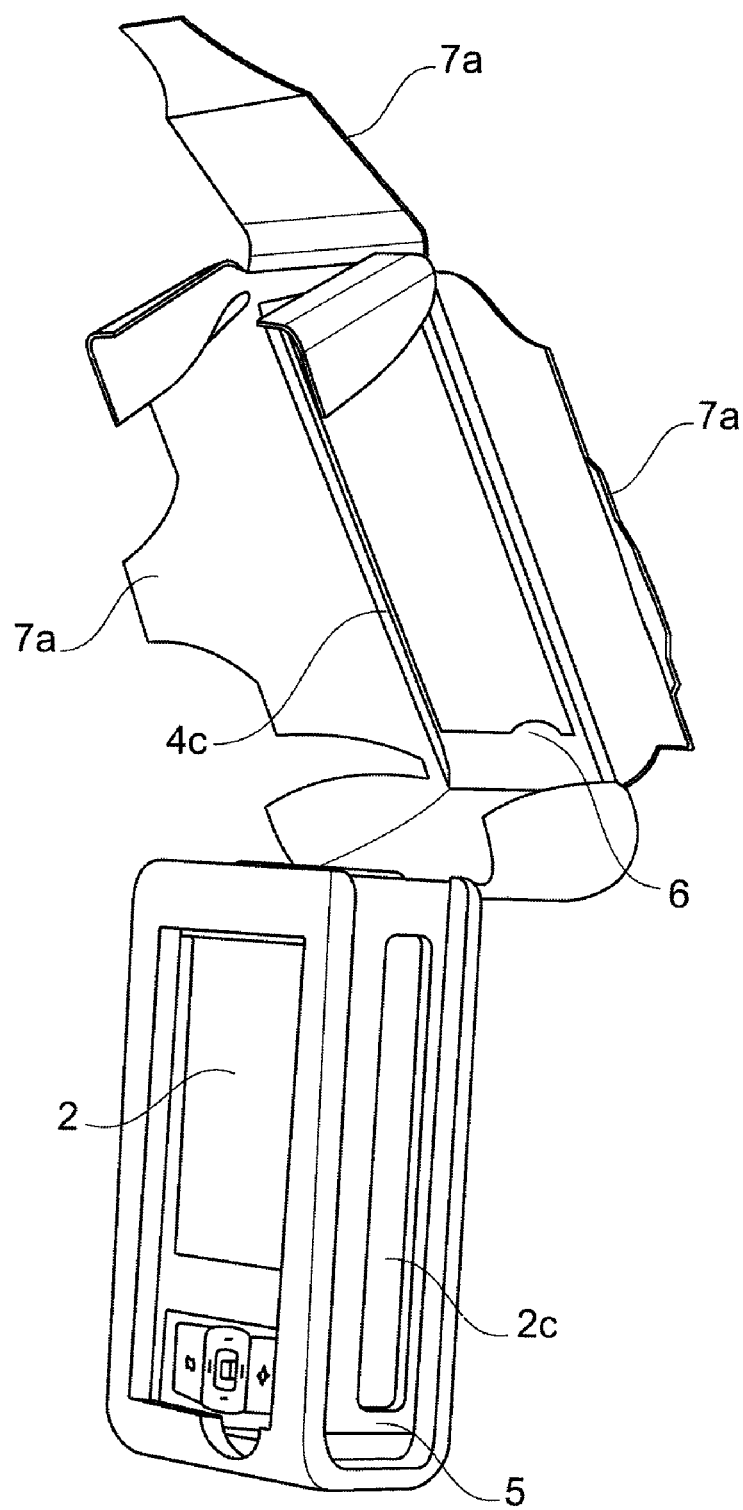
FIGS. 12A, 12B, and 12C represent a view in perspective of the module, open and attached to the case, from a ¾ face, back and ¾ back perspective respectively, according to the third embodiment of the device, with Velcro strips being positioned at the back of the case so that they are opposite to the tabs when the module is closed, FIG. 13 schematically illustrates the test rig located in an anechoic chamber and created for measurement purposes.

In this way, and as illustrated in FIGS. 11A and 12A, the ergonomic interface (2a) is orientated toward the leg of the U representing the cut-away face of the hollow element (5), and the periphery of the mobile telephone (2) close to the microphone is oriented toward the bottom of the U representing the solid side of the periphery of the hollow element (5), with this solid side of the periphery being arranged so as to render impossible the orientation of the ergonomic interface (2a) toward the leg of the U representing the solid face of the hollow element (5).

Thus, the user is able to see the ergonomic interface (2a) through the cut-away face of the hollow element (5), and cannot err regarding the correct direction of insertion of the mobile telephone (2) into the hollow element (5).

Additionally, and as illustrated in FIG. 7, the hollow element (5) is fitted with two hollowed out slides positioned facing and between the opposite faces of the hollow element (5) and perpendicular to the opposite faces of the hollow element (5). Each slide (5a) is located close to one of the two cut-away sides of the periphery covering the depth of the hollow element (5), so as to guide the insertion of the mobile telephone (2) and to hold the mobile telephone (2) in the hollow element (5). The mobile telephone (2) can then be inserted into the hollow element (5) only by the cut-away side of the periphery of the hollow element (5) away from the solid side of the periphery of the hollow element (5). The mobile telephone (2) cannot exit from its container formed by the hollow element (5) via the sides of the periphery of the hollow element (5) enclosed by the slides, and the user can remove the mobile telephone (2) from the hollow element (5) by pinching the mobile telephone (2) through the cut-away parts of the slides (5a) and by pulling it out of the hollow element (5).

As previously mentioned, and as illustrated in FIGS. 7, 8A and 8B, the protective frame (1b) in the third embodiment includes two distinct parts, each created, at least in part, from a highly conducting solid material. The first part, forming a frame (1ba), is attached onto the cut-away face of the hollow element (5). This frame (1ba) firstly forms the concave space of the protective element (1) and secondly is suitably dimensioned to fit over at least one third of the thickness of the mobile telephone (2) inserted into the hollow element (5). The second part, forming a flat frame (1bb), acts as a support to attach the two sliding rails (4c) of the blind mechanism in electrically conducting contact.

It now remains to us to describe the relative arrangement of:
- the hollow element (5) on which the frame (1ba) is fixed,
- the frame (1bb) of plane section supporting the sliding rails (4c) of the blind mechanism, and
- the storage area (4a) for the blind mechanism, in which the thin film (1ba) that is used as the blind is mounted, rolled around the roll-unroll mechanism (4b), and to render the whole aesthetic, the general idea being to cover the different elements of the device with a noble material, such as leather, while still retaining the biological protection characteristic of the device.

Figure 12B:
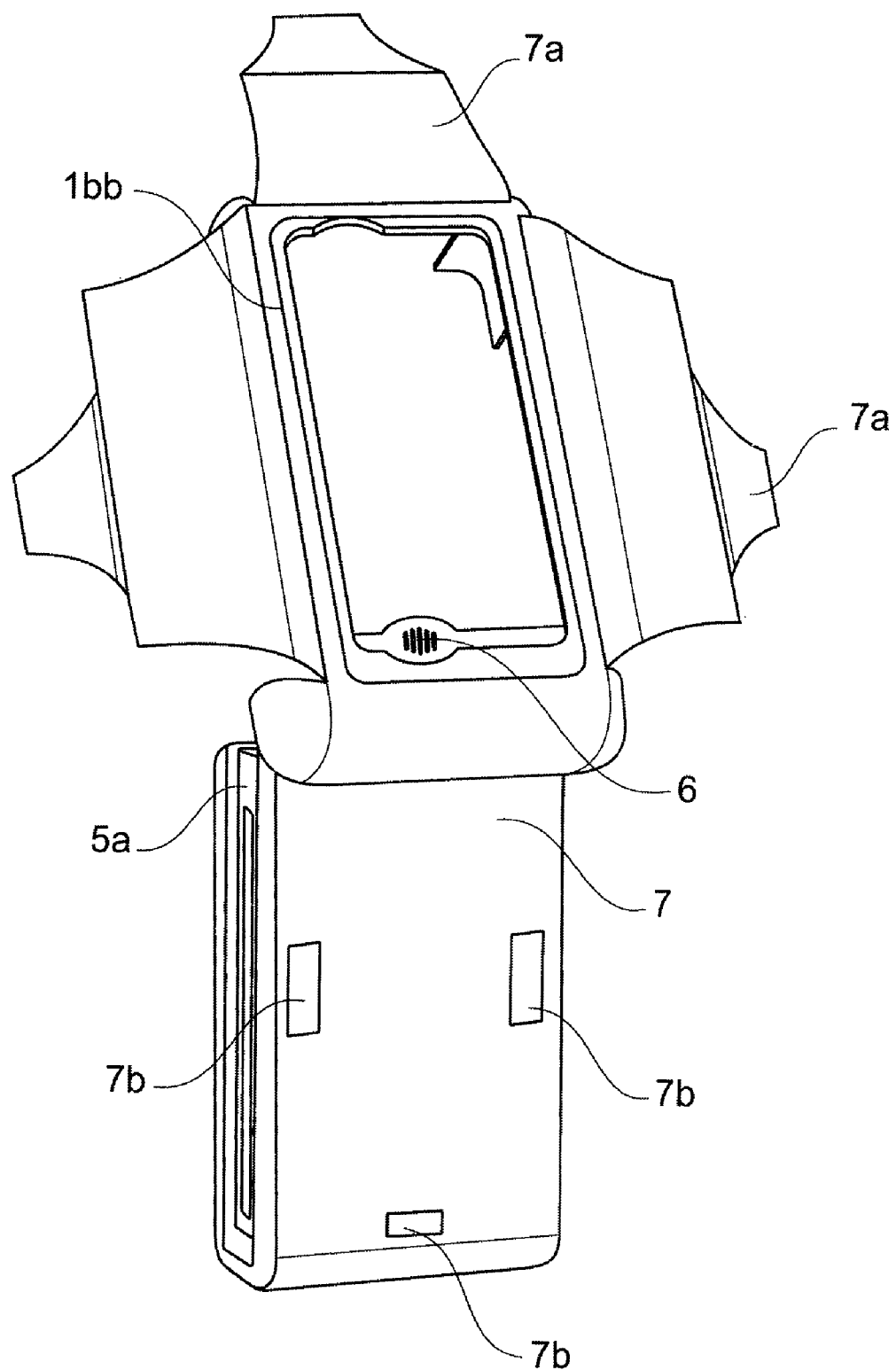
Figure 12C:
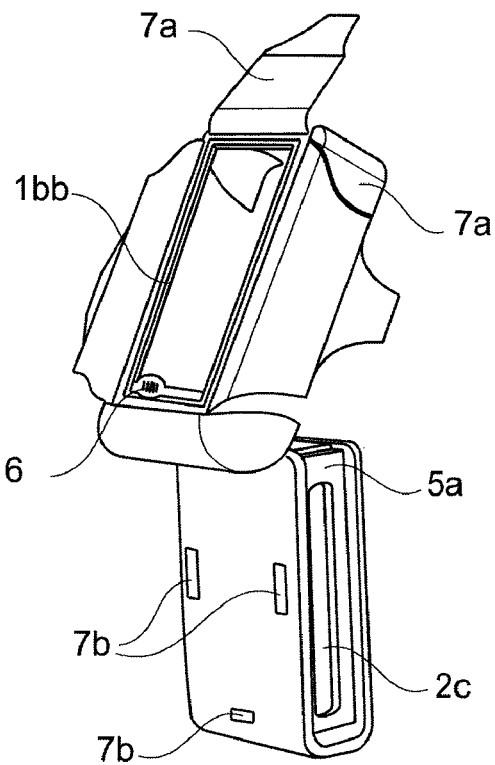

Firstly, and as illustrated in FIGS. 12A to 12C, the hollow element (5), and the frame (1bb) forming part of the protective frame (1b) fixed onto the cut-away face of the hollow element (5), are covered with a fine flexible material, such as leather, for example, so as to mask the plastic structure of the hollow element (5), possibly manufactured by moulding and therefore exhibiting moulding marks, and the metallic structure of the frame (1ba), potentially composed of several assembled metallic and plastic parts, so that the user is conscious only of single, aesthetically pleasing case.

Secondly, and as illustrated in FIG. 12B, the frame (1bb) of plane section supporting the sliding rails (4c) of the blind mechanism, and the storage area (4a) for the blind mechanism in which the thin film (1ba) that is used as the blind rolled around the roll-unroll mechanism (4b) is mounted, are incorporated into a module (7).

On the one hand, and as illustrated in FIGS. 9A, 9B, 11A and 11B, this module (7) must be arranged so that it can fold over and be attached to the case so that the flat frame (1bb) supporting the sliding rails (4c) and the storage area (4a) for the blind mechanism are in electrically conducting contact and, together with the frame (1ba), form the protective element (1) that is proof against the electromagnetic waves and generally concave.

On the other hand, and as illustrated in FIGS. 12A to 12C, the module (7) must be arranged so as to be removable from the case, so that the user is able, when so required, to reach the mobile telephone housed in the case, in order to remove it from the case or use connectors for example.

In order to meet these objectives, the module (7) is necessarily of complex shape, illustrated in FIGS. 12A to 12C, and has several characteristics.

Firstly and as illustrated in FIGS. 7, 8A, 8B, 10A and 10B, the storage area (4a) for the blind mechanism, when closed by its lid (4ab), which is dimensioned and shaped so as to let pass and to guide the thin film (1ab) that is used as the blind toward the sliding rails (4c), is of a particular design that is able, firstly, to fit flush, by a part of its surface, with the part of the outer periphery of the frame (1ba) that is located closest to the loudspeaker of the mobile telephone (2), and secondly, to fit flush, by the other part of its surface, with a part of the module that is complementary to it in shape and dimension, and onto which the storage area is attached.

Secondly, and as illustrated in FIGS. 10B, 12A, 12B and 12C, the flat frame (1bb) supporting the sliding rails (4c) is integrated into the module (7), with the sliding rails (4c) being located inside the module (7) when the latter is closed onto the case.

Thirdly, and as illustrated in FIGS. 12A to 12C, the module (7) has a plurality of cut-outs and hinges forming tabs (7a) articulated on the frame (1bb), with these tabs (7a) being used to free the openings provided in the case for the connectors.

Fourthly, and as illustrated in FIG. 12A, the sliding rails (4c) fixed to the flat frame (1bb) are located not only inside the folded module (7), but also in the extension of the exit from the storage area (4a) (see FIG. 5, 8A, 8B and 10A), so that the thin film (1ab), in the rolled up position and locked by the hollow element (6) coming up against the flat frame (1bb), remains partially engaged in and between the sliding rails (4c), whether the module (7) is open or closed.

Fifthly, and as illustrated in FIG. 11B, the cut-outs and the hinges of the module (7) are arranged to allow the tabs (7) to be attached to the back of the case onto Velcro strips (7b) (see FIGS. 12B and 12C) that are fixed to the back of the case opposite to each tab (7a), so as to hold the module (7) securely on the case.

And finally, the different embodiments of the protective element (1) have been the subject of a scientific study conducted by Pr. Joseph Saillard of the IREENA laboratory at Nantes University, confirming the effectiveness of the device of the invention.

Figure 13:
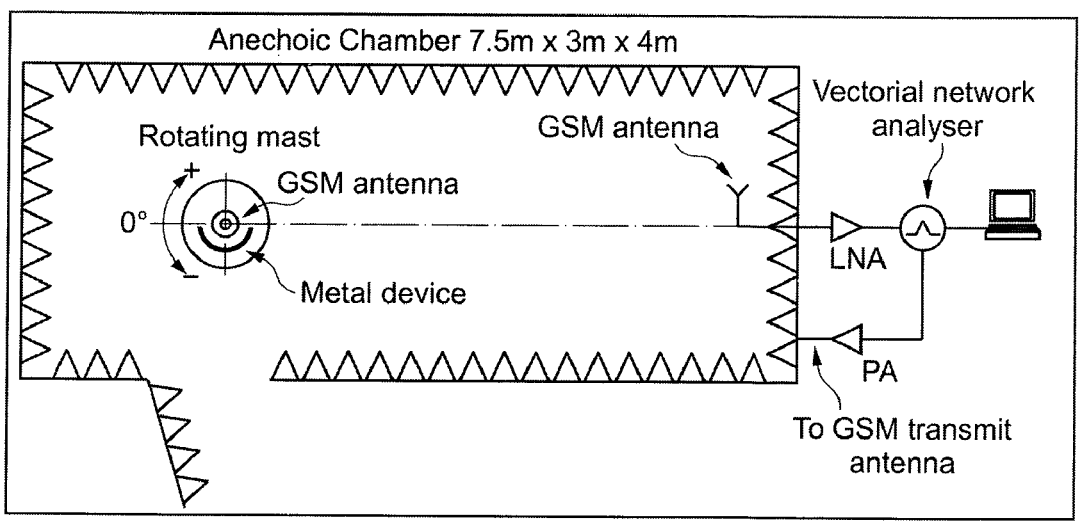

FIG. 13 schematically illustrates the test rig, located in an anechoic chamber and created for measurement purposes. This rig includes a mobile telephone (2), represented by a GSM antenna and emitting a continuous electromagnetic signal at a frequency of 940 MHz, a protective element (1) mounted on a rotating mast, a GSM receive antenna, and measurement means located outside the anechoic chamber.

Figure 14:
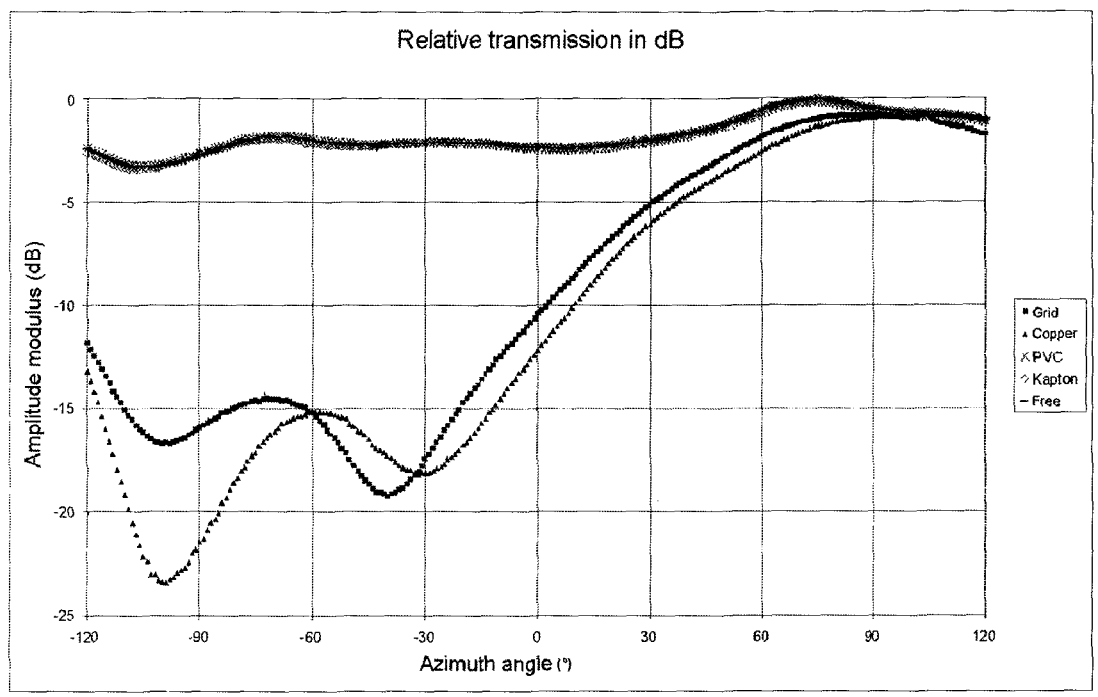
FIG. 14 represents a graph of the transmission measurements as a function of the angle of a rotating mast for the various components that in part constitute the protective element.

FIG. 14 contains a graph of the transmission measurements as a function of the angle of the rotating mast effected alternatively with no protective element (1), with the metallic mesh (1aa) made from copper deposited onto a kapton membrane which is partially transparent in the visible spectrum, and then with a solid surface in copper affixed to a PVC membrane in order to form the thin film (1ab).

Three groups of curves emanate from this process.

The curves of the first group, represented by those whose variations in the measurement range are smallest, correspond to the transmission readings as a function of the angle of the rotating mast effected, with no protective element (1), metallic or otherwise, with the kapton and PVC membranes, but with no metallic protective element (1). The variation in attenuation over the measurement range is of the order of 3 dB. The three curves are coincident.

The curve of the second group is that obtained in the presence of the metallic protection (1). This represents attenuation of the electromagnetic signal emitted by the mobile telephone (2) of greater than 15 dB over an angular sector of 100°.

The curve of the third group represents the attenuation as a function of the phase offset angle brought about by the metallic copper mesh (1aa) deposited onto the kapton membrane. For the same angular sector of 100°, this attenuation is greater than 12 dB.

The various embodiments, described above, of the protection device according to the invention can be combined in any appropriate manner, unless they are mutually incompatible. In this description, numerous specific details are provided as illustrative and not restrictive, so as to specifically detail the invention. The one skilled in the art will understand, however, that the invention can be achieved in the absence of one or more of these specific details or with variations. At other times, some aspects are not detailed in order to avoid making cumbersome and obscuring this description and the man skilled in the art will appreciate that many and various means should be used and that the invention is not limited to the only examples described.

It should be obvious to all of those who are skilled in the art that this present invention allows embodiments in many other specific forms without moving it outside the field of application of the invention as claimed. As a consequence, these present embodiments must be considered as provided by way of illustration, but can be modified within the field determined by the scope of the attached claims, and the invention must not be limited to the details provided above.

The invention claimed is:

1. A device providing biological protection against the electromagnetic waves emitted by a mobile telephone receivable in the device, wherein said device includes a protective element protecting against the electromagnetic waves and made at least in part from a highly conducting metallic material, and arranged forming an open, generally concave receptacle, approximately in the shape of a rectangular parallelepiped with rounded corners whose base forms a flat or slightly concave protective screen which is arranged to be located between the mobile telephone and its user, and whose periphery covering the thickness forms a protective frame of curvilinear section, with the mobile telephone being held in the concave space of the protective element by at least one retention or attachment device in non-conducting, insulating material, positioned in the receptacle to maintain an electrically insulating space with a thickness of at least 2 mm between the metallic part of the protective element and the mobile telephone, with the screen and the frame being made, at least in part, from a highly conducting material and arranged so that the part of the screen made from a highly conducting material is in electrically conducting contact with the part of the frame made from a highly conducting material to protect against the electromagnetic waves and concave overall to at least partially constitute the protective element.

2. A device according to claim 1, wherein the length of the protective element is equal to or greater than 1.15 times the length of the mobile telephone, the width of the protective element is equal to or greater than 1.2 times the width of the mobile telephone, and the depth of the protective element is equal to or greater than 1.3 times the thickness of the mobile telephone.

3. A device according to claim 2, wherein the length of the protective element is less than or equal to 1.3 times the length of the mobile telephone, the width of the protective element is less than or equal to 1.3 times the width of the mobile telephone, and the depth of the protective element is less than or equal to 1.6 times the thickness of the mobile telephone.

4. A device according to claim 1, wherein the electrically insulating space between the metallic part of the protective element and the ergonomic interface of the mobile telephone has a thickness between 3 mm and 8 mm.

5. A device according to claim 1, wherein the screen or/and the frame of the protective element include one or more orifices of a size that is less than the various wavelengths of the electromagnetic waves used in various mobile telephone standards, this orifice or these orifices being either located opposite to the microphone and/or of the loudspeaker and/or any other device included in the mobile telephone and used to receive and/or transmit acoustic waves, and arranged to prevent distortion of acoustic waves by the protective element, or located opposite to the connectors of the mobile telephone.

6. A device according to claim 1, wherein the screen of the protective element includes at least one gridded mesh made from a highly conducting material and with a grid pitch, either regular or not, equal to or less than 10 mm, with the highly conducting material constituting conducting lines having a width of 0.5 mm and with a thickness of 50 μm.

7. A device according to claim 6, wherein the conducting gridded mesh is incorporated into or screen printed onto a membrane, or woven into an even finer mesh made from a flexible material that is transparent in the visible spectrum so as to allow the user to see the ergonomic interface of the mobile telephone and more particularly the display screen of the mobile telephone.

8. A device according to claim 6, wherein the flat or slightly concave screen is attached to and stretched onto the frame of the protective element, which includes at least one part made from a highly conducting metallic material at its surface or within its thickness, so that the metallic gridded mesh in part constituting the screen is in electrically conducting contact with the metallic part of the frame, so as to form a whole that is proof against the electromagnetic waves, and concave overall and curved so that it partially constitutes the protective element.

9. A device according to claim 1, wherein the screen of the protective element includes at least one thin film.

10. A device according to claim 9, wherein the thin film includes at least one part of its surface made from a highly conducting metallic material, deposited onto, or incorporated into, a membrane made from a flexible material, so that the thin film is sufficiently flexible to be railed back onto itself.

11. A device according to claim 9, wherein the frame of the protective element includes at least one part made from a highly conducting metallic material at its surface or within its thickness and is arranged into a functional combination with at least one blind mechanism.

12. A device according to claim 11, wherein each blind mechanism includes a storage area that is dimensioned and shaped so as to be able to contain at least one blind fully wound around a roll-unroll mechanism, secured by attachment means approximately at the centre of the storage area and located in the sliding plane of the blind, and a set of two sliding rails parallel to the blind and located in the sliding plane of the blind in order to guide the movement of the blind, with the stiffness of the blind being sufficient to control the winding by raising the free end of the blind and with the storage area of the blind mechanism being integrated into the interior of one of the four sides of the periphery of the protective frame.

13. A device according to claim 9, wherein the two sliding rails are made, at least in part, from a highly conducting material, fixed onto the frame so as to create an electrically conducting contact with the metallic part of the frame, and each sliding rail is fitted with a plurality of conducting lips distributed at regular intervals over the length of the sliding rail between the legs of the U-shape formed by the sliding rail, with each conducting lip being attached in electrically conducting contact onto a first of the two legs of the U-shape, and being shaped and dimensioned so as to leave a constant space between the latter and the second of the two legs of the U-shape, of a width that is at least equal to the thickness of the blind.

14. A device according to claim 9, wherein the blind mechanism is arranged so that the conducting thin film that is used as the blind is able to alternatively cover and expose the ergonomic interface of the mobile telephone, with the two sliding rails, the frame and the thin film being arranged so as to ensure continuity of the electrical contact between the conducting metallic parts constituting them, so as to form a whole that is proof against the electromagnetic waves and concave overall so that it partially constitutes the protective element, when the thin film is fully unrolled.

15. A device according to claim 9, wherein the protective screen with the thin film includes an element of hollowed-out shape and partially complementary to the thumb of the user, fixed onto the thin film to make it easier for the user to manipulate the thin film that is used as the blind, and to play the role of a stop element so as to prevent the thin film from disappearing totally into the storage area for the blind mechanism.

16. A device according to claim 9, wherein the protective frame is surmounted by a flat frame made from an insulating material, which is dimensioned and shaped so that it can be attached to the protective frame between the protective screen and the user in order to protect the blind mechanism and the protective screen that is used as the blind, while still not obscuring the view through the protective element of the ergonomic interface of the mobile telephone and so that the thin film which is fully rolled and locked by the hollow element, coming up against the interior of the periphery of the flat frame, remains partially engaged in and between the sliding rails.

17. A protection device configured to receive a mobile telephone, the protection device comprising:
- a protective element, the protective element composed at least in part of a highly conductive metallic material;
- a base protective screen, the base protective screen composed at least in part of a highly conductive material;
- a protective frame covering the thickness and having a curvilinear section, the protective frame composed at least in part of a highly conductive material; and
- at least one retention device, the retention device composed of a non-conducting, insulating material, the retention device positioned with respect to the highly conductive metallic material of the protective element to maintain an electrically insulating space having a thickness of at least 2 mm between the highly conductive metallic material of the protective element and the received mobile telephone,
- wherein the base protective screen is in electrically conducting contact with the highly conductive material portion of the protective frame, the base protective screen and protective frame forming a concave shape configured to receive at least a portion of the mobile telephone.

18. The protection device as claimed in claim 17, wherein the base protective screen is slightly concave.

* * * * *